United States Patent
Song et al.

(10) Patent No.: US 12,111,691 B2
(45) Date of Patent: Oct. 8, 2024

(54) ELECTRONIC DEVICE INCLUDING ADHESION MEMBER

(71) Applicant: Samsung Electronics Co., Ltd., Suwon-si (KR)

(72) Inventors: Seungwon Song, Suwon-si (KR); Jungim Ye, Suwon-si (KR); Changrak Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 141 days.

(21) Appl. No.: 17/971,191

(22) Filed: Oct. 21, 2022

(65) Prior Publication Data
US 2023/0142809 A1 May 11, 2023

Related U.S. Application Data

(63) Continuation of application No. PCT/KR2022/015545, filed on Oct. 14, 2022.

(30) Foreign Application Priority Data

Nov. 10, 2021 (KR) .......... 10-2021-0154114
Nov. 30, 2021 (KR) .......... 10-2021-0168596

(51) Int. Cl.
*G06F 1/16* (2006.01)
*H04M 1/02* (2006.01)

(52) U.S. Cl.
CPC .......... *G06F 1/1637* (2013.01); *G06F 1/1656* (2013.01); *H04M 1/0266* (2013.01)

(58) Field of Classification Search
CPC .......... H04M 1/0266; G06F 1/1637
See application file for complete search history.

(56) References Cited

U.S. PATENT DOCUMENTS 4,120,714 A 10/1978 Colombani et al.
4,906,067 A 3/1990 Mayr et al.
(Continued)

FOREIGN PATENT DOCUMENTS

CN 108600441 A 9/2018
JP 2018-160538 A 10/2018
(Continued)

OTHER PUBLICATIONS

US 9,301,035 B2, 03/2016, Kang et al. (withdrawn)
International Search Report dated Feb. 6, 2023, issued in International patent application No. PCT/KR2022/015545.

*Primary Examiner* — Nidhi Thaker
(74) *Attorney, Agent, or Firm* — Jefferson IP Law, LLP

(57) ABSTRACT

An electronic device is provided. The electronic device includes a first plate including a flat area facing a first direction and a curved area extending from at least a portion of a periphery of the flat area, a second plate facing a second direction that is opposite to the first direction, a side member surrounding an interior space between the first plate and the second plate and including a first outer surface facing the flat area, and a second outer surface facing the curved area, a plurality of adhesion tunnels formed to pass through the side member from the first outer surface to the second outer surface, and an adhesion member filled in interiors of the plurality of adhesion tunnels to be formed between the first plate and the side member, and contacting the curved area and the flat area.

20 Claims, 22 Drawing Sheets

(56) References Cited

U.S. PATENT DOCUMENTS

| | | |
|---|---|---|
| 4,957,121 A | 9/1990 | Icenogle et al. |
| 5,062,740 A | 11/1991 | Payne |
| 5,136,751 A | 8/1992 | Coyne et al. |
| 5,145,282 A | 9/1992 | Payne |
| 5,457,932 A | 10/1995 | Spada et al. |
| 5,620,058 A | 4/1997 | Forrester |
| 5,778,506 A | 7/1998 | Gonzalez |
| 5,956,612 A | 9/1999 | Elliott et al. |
| 6,053,214 A | 4/2000 | Sjoberg et al. |
| 6,118,426 A | 9/2000 | Albert et al. |
| 6,426,794 B1 | 7/2002 | Trainoff |
| 6,452,672 B1 | 9/2002 | Trainoff |
| 6,656,018 B1 | 12/2003 | Hsu et al. |
| 6,890,244 B2 | 5/2005 | Hsu et al. |
| 7,118,942 B1 | 10/2006 | Li |
| 7,125,189 B2 | 10/2006 | Gueret |
| 7,133,222 B2 | 11/2006 | Chintala et al. |
| 7,137,182 B2 | 11/2006 | Nelson |
| 7,163,825 B2 | 1/2007 | Gault |
| 7,166,924 B2 | 1/2007 | Lu et al. |
| 7,181,825 B2 | 2/2007 | Yao et al. |
| 7,282,213 B2 | 10/2007 | Schroeder et al. |
| 7,296,581 B2 | 11/2007 | Gold |
| 7,420,810 B2 | 9/2008 | Reis et al. |
| 7,441,393 B2 | 10/2008 | Piva et al. |
| 7,501,737 B2 | 3/2009 | Yao et al. |
| 7,554,787 B2 | 6/2009 | Pelrine et al. |
| 7,597,682 B2 | 10/2009 | Moberg |
| 7,600,422 B2 | 10/2009 | Hasebe |
| 7,727,915 B2 | 6/2010 | Skirius et al. |
| 7,833,338 B2 | 11/2010 | Crews et al. |
| 7,837,009 B2 | 11/2010 | Gross et al. |
| 7,977,224 B2 | 7/2011 | Hager, IV et al. |
| 7,989,388 B2 | 8/2011 | Incorvia et al. |
| 8,055,310 B2 | 11/2011 | Beart et al. |
| 8,057,208 B2 | 11/2011 | Bambi et al. |
| 8,077,411 B2 | 12/2011 | Shyu et al. |
| 8,217,381 B2 | 7/2012 | Rogers et al. |
| 8,222,777 B2 | 7/2012 | Loussert et al. |
| 8,253,633 B2 | 8/2012 | Sanz et al. |
| 8,283,189 B2 | 10/2012 | Francis et al. |
| 8,287,209 B2 | 10/2012 | Feldman et al. |
| 8,343,068 B2 | 1/2013 | Najafi et al. |
| 8,350,775 B2 | 1/2013 | Obermaier et al. |
| 8,357,865 B2 | 1/2013 | Ng et al. |
| 8,430,146 B2 | 4/2013 | Ferrone |
| 8,509,475 B2 | 8/2013 | Denzler et al. |
| 8,730,181 B1 | 5/2014 | Raman et al. |
| 8,849,441 B2 | 9/2014 | Boyden et al. |
| 8,855,728 B2 | 10/2014 | Ogatsu |
| 8,921,473 B1 | 12/2014 | Hyman |
| 8,959,555 B2 | 2/2015 | Monari et al. |
| 9,022,443 B1 | 5/2015 | Aberth |
| 9,220,570 B2 | 12/2015 | Kim et al. |
| 9,232,680 B2 | 1/2016 | Yi et al. |
| 9,274,320 B2 | 3/2016 | Zhou et al. |
| 9,288,918 B2 | 3/2016 | Sersch |
| 9,344,135 B2 | 5/2016 | Fiorentino |
| 9,368,429 B2 | 6/2016 | Ma et al. |
| 9,380,366 B2 | 6/2016 | Kang et al. |
| 9,431,630 B2 | 8/2016 | Huang et al. |
| 9,473,604 B2 | 10/2016 | Choi et al. |
| 9,516,752 B2 | 12/2016 | Brusso et al. |
| 9,531,424 B1 | 12/2016 | Tucher |
| 9,539,955 B2 | 1/2017 | Earley et al. |
| 9,674,922 B2 | 6/2017 | Malon et al. |
| 9,681,996 B2 | 6/2017 | Prioleau et al. |
| 9,683,197 B2 | 6/2017 | Aizenberg et al. |
| 9,716,467 B2 | 7/2017 | Spotti |
| 9,718,629 B2 | 8/2017 | Wenninger et al. |
| 9,726,395 B2 | 8/2017 | Hammer |
| 9,753,489 B2 | 9/2017 | Carvey et al. |
| 9,757,271 B2 | 9/2017 | Shih |
| 9,886,613 B2 | 2/2018 | Pi et al. |
| 9,888,101 B2 | 2/2018 | Al et al. |
| 9,895,798 B2 | 2/2018 | Helmer |
| 9,945,140 B2 | 4/2018 | Lacalle Bayo et al. |
| 10,002,750 B2 | 6/2018 | Toutoungi et al. |
| 10,011,089 B2 | 7/2018 | Lyons et al. |
| 10,019,034 B2 | 7/2018 | Barnett et al. |
| 10,061,057 B2 | 8/2018 | Wong et al. |
| 10,088,112 B2 | 10/2018 | Crayford et al. |
| 10,158,164 B2 | 12/2018 | Gagne-Keats |
| 10,161,147 B2 | 12/2018 | Jornitz |
| 10,232,586 B2 | 3/2019 | Dollase et al. |
| 10,244,785 B2 | 4/2019 | Mou et al. |
| 10,302,227 B1 | 5/2019 | Gustaveson, II |
| 10,318,786 B2 | 6/2019 | Pi et al. |
| 10,359,570 B1 | 7/2019 | Belt et al. |
| 10,390,602 B2 | 8/2019 | Willet, Jr. |
| 10,439,666 B2 | 10/2019 | Yamaguch et al. |
| 10,447,966 B2 | 10/2019 | Ritchey et al. |
| 10,484,035 B2 | 11/2019 | Flores et al. |
| 10,565,899 B1 | 2/2020 | Dignam et al. |
| 10,573,516 B2 | 2/2020 | Odnoblyudov et al. |
| 10,575,696 B2 | 3/2020 | O'Brien et al. |
| 10,581,269 B2 | 3/2020 | Valin |
| 10,631,620 B2 | 4/2020 | Tucker |
| 10,640,655 B2 | 5/2020 | Kim et al. |
| 10,649,202 B2 | 5/2020 | Costantini et al. |
| 10,649,439 B2 | 5/2020 | Wang et al. |
| 10,860,061 B2 * | 12/2020 | Park .................. H04M 1/18 |
| 10,897,827 B2 * | 1/2021 | Cho .................. G06F 1/1626 |
| 11,343,362 B2 * | 5/2022 | Park .................. C09J 5/06 |
| 11,379,000 B2 | 7/2022 | Yin et al. |
| 11,402,875 B2 * | 8/2022 | Cho .................. G06F 1/1626 |
| 11,452,220 B2 | 9/2022 | Cho et al. |
| 2003/0129016 A1 | 7/2003 | Gueret |
| 2004/0058434 A1 | 3/2004 | Gault |
| 2004/0062852 A1 | 4/2004 | Schroeder et al. |
| 2004/0072507 A1 | 4/2004 | Hsu et al. |
| 2004/0092873 A1 | 5/2004 | Moberg |
| 2004/0098852 A1 | 5/2004 | Nelson |
| 2004/0226165 A1 | 11/2004 | Yao et al. |
| 2005/0155620 A1 | 7/2005 | Gold |
| 2006/0038273 A1 | 2/2006 | Lu et al. |
| 2006/0077571 A1 | 4/2006 | Chintala et al. |
| 2006/0205381 A1 | 9/2006 | Beart et al. |
| 2006/0220493 A1 | 10/2006 | Yao et al. |
| 2007/0151223 A1 | 7/2007 | Piva et al. |
| 2008/0047339 A1 | 2/2008 | Hasebe |
| 2008/0060551 A1 | 3/2008 | Crews et al. |
| 2008/0062651 A1 | 3/2008 | Reis et al. |
| 2008/0157235 A1 | 7/2008 | Rogers et al. |
| 2008/0197728 A1 | 8/2008 | Loussert et al. |
| 2008/0207441 A1 | 8/2008 | Incorvia et al. |
| 2008/0211341 A1 | 9/2008 | Pelrine et al. |
| 2009/0230591 A1 | 9/2009 | Bambi et al. |
| 2010/0029349 A1 | 2/2010 | Ogatsu |
| 2010/0095846 A1 | 4/2010 | Skirius et al. |
| 2010/0105166 A1 | 4/2010 | Francis et al. |
| 2010/0123642 A1 | 5/2010 | Sanz et al. |
| 2010/0133656 A1 | 6/2010 | Hager, IV et al. |
| 2010/0150656 A1 | 6/2010 | Feldman et al. |
| 2010/0163171 A1 | 7/2010 | Ferrone |
| 2010/0168900 A1 | 7/2010 | Boyden et al. |
| 2010/0182213 A1 | 7/2010 | Obermaier et al. |
| 2010/0262036 A1 | 10/2010 | Najafi et al. |
| 2010/0300230 A1 | 12/2010 | Helmer |
| 2011/0025876 A1 | 2/2011 | Denzler et al. |
| 2011/0079497 A1 | 4/2011 | Ng et al. |
| 2011/0102920 A1 | 5/2011 | Shyu et al. |
| 2013/0041334 A1 | 2/2013 | Prioleau et al. |
| 2013/0208411 A1 | 8/2013 | Brusso et al. |
| 2013/0249109 A1 | 9/2013 | Ma et al. |
| 2014/0005684 A1 | 1/2014 | Kim et al. |
| 2014/0013361 A1 | 1/2014 | Monari et al. |
| 2014/0050921 A1 | 2/2014 | Lyons et al. |
| 2014/0055237 A1 | 2/2014 | Sersch |
| 2014/0141709 A1 | 5/2014 | Hammer |
| 2014/0198464 A1 | 7/2014 | Yi et al. |
| 2014/0241564 A1 | 8/2014 | Kang et al. |
| 2014/0265821 A1 | 9/2014 | Malon et al. |
| 2014/0328999 A1 | 11/2014 | Aizenberg et al. |

(56) References Cited

U.S. PATENT DOCUMENTS

| | | |
|---|---|---|
| 2014/0354856 A1 | 12/2014 | Zhou et al. |
| 2015/0063976 A1 | 3/2015 | Wenninger et al. |
| 2015/0073326 A1 | 3/2015 | Shih |
| 2015/0101264 A1 | 4/2015 | Jornitz |
| 2015/0183381 A1 | 7/2015 | Earley et al. |
| 2015/0364718 A1 | 12/2015 | Huang et al. |
| 2015/0372642 A1 | 12/2015 | Spotti |
| 2015/0372705 A1 | 12/2015 | Fiorentino |
| 2016/0000139 A1 | 1/2016 | Mou et al. |
| 2016/0004899 A1 | 1/2016 | Pi et al. |
| 2016/0167339 A1 | 6/2016 | Dollase et al. |
| 2016/0243477 A1 | 8/2016 | Skirius et al. |
| 2016/0255305 A1 | 9/2016 | Ritchey et al. |
| 2016/0306384 A1 | 10/2016 | Carvey et al. |
| 2016/0316047 A1 | 10/2016 | Al et al. |
| 2016/0336159 A1 | 11/2016 | Toutoungi et al. |
| 2017/0052277 A1 | 2/2017 | Wong et al. |
| 2017/0114560 A1 | 4/2017 | Lacalle Bayo et al. |
| 2017/0181530 A1 | 6/2017 | Tucker |
| 2017/0191624 A1 | 7/2017 | Crayford et al. |
| 2017/0306163 A1 | 10/2017 | Kim et al. |
| 2017/0373377 A1 | 12/2017 | Gagne-Keats |
| 2018/0004250 A1 | 1/2018 | Barnett et al. |
| 2018/0014709 A1 | 1/2018 | O'Brien et al. |
| 2018/0035786 A1 | 2/2018 | Willet, Jr. |
| 2018/0131229 A1 | 5/2018 | Valin |
| 2018/0134016 A1 | 5/2018 | Burns et al. |
| 2018/0152218 A1 | 5/2018 | Flores et al. |
| 2018/0278288 A1 | 9/2018 | Yamaguch et al. |
| 2019/0005292 A1 | 1/2019 | Pi et al. |
| 2019/0086899 A1 | 3/2019 | Wang et al. |
| 2019/0121122 A1 | 4/2019 | Costantini et al. |
| 2019/0172709 A1 | 6/2019 | Odnoblyudov et al. |
| 2019/0246507 A1 | 8/2019 | Hisano |
| 2020/0186183 A1 * | 6/2020 | Park ............... H04M 1/18 |
| 2020/0253064 A1 | 8/2020 | Cho et al. |
| 2020/0336576 A1 | 10/2020 | Park et al. |
| 2021/0103312 A1 | 4/2021 | Yin et al. |
| 2021/0144866 A1 | 5/2021 | Cho et al. |
| 2022/0253107 A1 | 8/2022 | Nguyen Van et al. |

FOREIGN PATENT DOCUMENTS

| | | | |
|---|---|---|---|
| JP | 2019-140437 A | 8/2019 | |
| KR | 10-2013-0100676 A | 9/2013 | |
| KR | 10-1492525 B1 | 2/2015 | |
| KR | 10-1614268 B1 | 4/2016 | |
| KR | 10-2016-0063677 A | 6/2016 | |
| KR | 10-2016-0128760 A | 11/2016 | |
| KR | 10-2017-0124139 A | 11/2017 | |
| KR | 10-1897943 B1 | 9/2018 | |
| KR | 10-2019-0088487 A | 7/2019 | |
| KR | 10-2093813 B1 | 3/2020 | |
| KR | 10-2020-0095738 A | 8/2020 | |
| KR | 10-2020-0122516 A | 10/2020 | |
| KR | 10-2020-0123627 A | 10/2020 | |
| KR | 10-2021-0080690 A | 7/2021 | |
| WO | WO-2020145680 A1 * | 7/2020 | ......... H04M 1/0202 |
| WO | 2021/071667 A1 | 4/2021 | |

* cited by examiner

ELECTRONIC DEVICE INCLUDING ADHESION MEMBER

CROSS-REFERENCE TO RELATED APPLICATION(S)

This application is a continuation application, claiming priority under § 365(c), of an International application No. PCT/KR2022/015545, filed on Oct. 14, 2022, which is based on and claims the benefit of a Korean patent application number 10-2021-0154114, filed on Nov. 10, 2021, in the Korean Intellectual Property Office, and of a Korean patent application number 10-2021-0168596, filed on Nov. 30, 2021, in the Korean Intellectual Property Office, the disclosure of each of which is incorporated by reference herein in its entirety.

TECHNICAL FIELD

The disclosure relates to an electronic device including an adhesion member.

BACKGROUND ART

Thanks to dazzling progresses of information/communication technologies and semiconductor technologies, various electronic devices are very increasingly distributed and used. In particular, recent electronic devices have been developed to perform communication while being carried. These electronic devices have a convergence function for complexly performing one or more functions.

The electronic devices tend to have various shapes and functions to satisfy purchase demands of consumers. Furthermore, a front plate for covering a display panel of an electronic device and a rear plate that covers a rear surface of the electronic device may implement a structure, in which it extends even to a side surface of the electronic device, to provide an appealing feeling to a user.

The above information is presented as background information only to assist with an understanding of the disclosure. No determination has been made, and no assertion is made, as to whether any of the above might be applicable as prior art with regard to the disclosure.

DISCLOSURE

Technical Problem

The rear plate that extends to the side surface of the electronic device may be attached to the side member through an adhesion member. When the rear plate fails to be properly attached to the side member, an external appearance error, such as coming-over of the rear plate may occur.

Aspects of the disclosure are to address at least the above-mentioned problems and/or disadvantages and to provide at least the advantages described below. Accordingly, an aspect of the disclosure is to provide an electronic device that may enhance an adhesion force between a rear plate and a side member.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes a first plate including a flat area facing a first direction and a curved area extending from at least a portion of a periphery of the flat area, a second plate facing a second direction that is opposite to the first direction, a side member surrounding an interior space between the first plate and the second plate and including a first outer surface facing the flat area, and a second outer surface facing the curved area, a plurality of adhesion tunnels formed to pass through the side member from the first outer surface to the second outer surface, and an adhesion member filled in interiors of the plurality of adhesion tunnels to be formed between the first plate and the side member, and contacting the curved area and the flat area, and each of the plurality of adhesion tunnels includes a first hole area overlapping the flat area, and passing through the first outer surface, a second hole area overlapping the curved area, and passing through the second outer surface, and a connection area disposed between the first hole area and the second hole area, and connecting the first hole area and the second hole area.

In accordance with another aspect of the disclosure, an electronic device is provided. The electronic device includes a rear plate including a flat area facing a first direction and a curved area extending from at least a portion of a periphery of the flat area, a front plate facing a second direction that is opposite to the first direction, a side member surrounding an interior space between the rear plate and the front plate, and having a plurality of adhesion tunnels facing the curved area from the flat area, and an adhesion member filled in interiors of the plurality of adhesion tunnels to be formed between the rear plate and the side member, and contacting the curved area and the flat area, each of the plurality of adhesion tunnels includes a first hole area overlapping the flat area and opened toward the flat area, a second hole area overlapping the curved area and opened toward the curved area, and a connection area disposed between the first hole area and the second hole area, and connecting the first hole area and the second hole area.

Advantageous Effects

According to the electronic device according to the embodiments disclosed in the disclosure, the rear plate and the side member may be coupled to each other through the adhesion member formed in the "L"-shaped adhesion tunnel.

The electronic device according to the embodiments disclosed in the disclosure may prevent a coming-over phenomenon of the rear plate and a gap defect phenomenon between the rear plate and the side member.

According to the electronic device according to the embodiments disclosed in the disclosure, adhesion force may be enhanced because the curved area of the rear plate defines a plurality of contact surfaces with the first adhesion members that passed through the plurality of adhesion tunnels.

According to the electronic device according to the embodiments disclosed in the disclosure, costs may be reduced and adhesion force may be enhanced by using a pressure sensitive adhesive of low costs and an excellent adhesion force as compared with a double-sided tape.

In addition, the disclosure may provide various effects that are directly or indirectly recognized.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modification of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
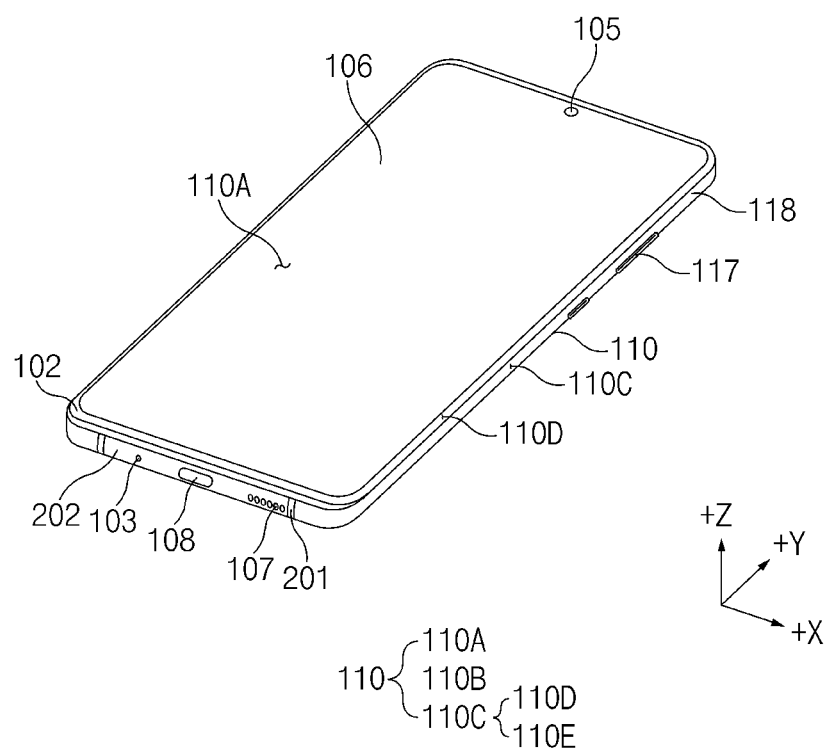
FIG. 1 illustrates a perspective view illustrating a front surface of an electronic device according to an embodiment of the disclosure.

FIG. 1 is a front perspective view of an electronic device according to an embodiment of the disclosure.

Figure 2:
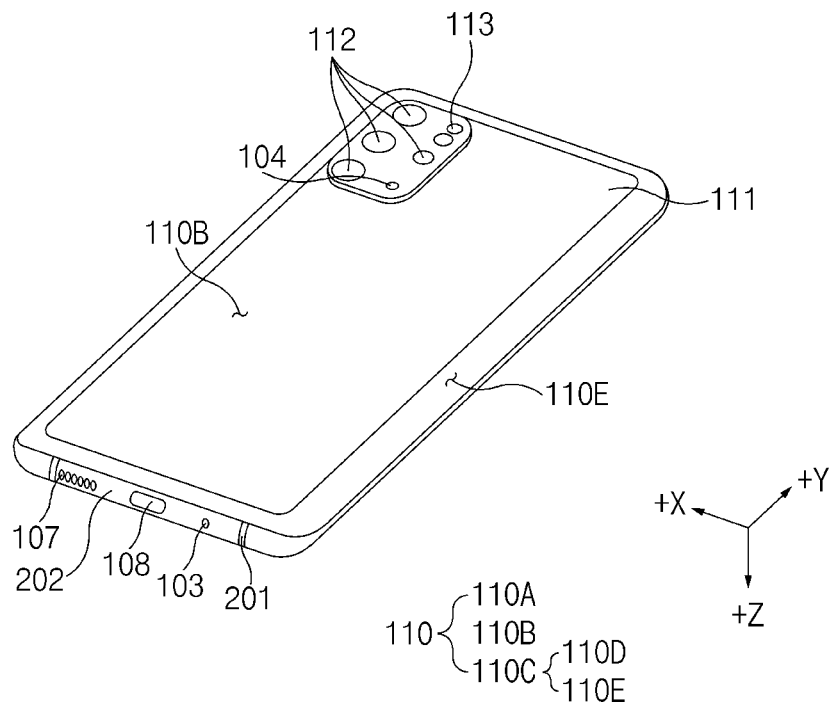
FIG. 2 illustrates a perspective view illustrating a rear surface of an electronic device according to an embodiment of the disclosure.

FIG. 2 is a rear perspective view of an electronic device according to an embodiment of the disclosure.

Referring to FIGS. 1 and 2, an electronic device 101 (e.g., an electronic device 401 in FIG. 5) may include a housing 110 including a first surface (or a front surface) 110A, a second surface (or a rear surface) 110B, and a side surface 110C that encloses a space between the first surface 110A and the second surface 110B.

In an embodiment (not shown), the housing 110 may refer to a structure that forms some of the first surface 110A, the second surface 110B, and the side surface 110C.

In another embodiment, the first surface 110A may be formed by a front surface plate 102 (e.g., a glass plate including various coating layers, or a polymer plate) at least a portion of which is substantially transparent. The second surface 110B may be formed by a substantially opaque rear surface plate 111. The rear surface plate 111 may be formed by, for example, coated or colored glass, ceramic, polymer, metal (e.g., aluminum, stainless steel (STS), or magnesium), or a combination of at least two of the above materials. The side surface 110C may be formed by a side surface bezel structure (or a "frame structure") 118 that is coupled to the front surface plate 102 and the rear surface plate 111, and contains metal and/or polymer.

In yet another embodiment, the rear surface plate 111 and the side surface bezel structure 118 may be integrally formed and may contain the same material (e.g., a metal material such as aluminum).

In the illustrated embodiment, the front surface plate 102 may include two first regions 110D bent from a region of the first surface 110A in a direction of the rear surface plate 111 to seamlessly extend. The first regions 110D may be located at ends of long edges of the front surface plate 102, respectively.

In the illustrated embodiment, the rear surface plate 111 may include two second regions 110E bent from a region of the second surface 110B in a direction of the front surface plate 102 to seamlessly extend. The second regions 110E may be located at ends of long edges of the rear surface plate 111, respectively.

In yet another embodiment, the front surface plate 102 (or the rear surface plate 111) may include only one of the first regions 110D (or of the second regions 110E). In addition, in yet another embodiment, the front surface plate 102 (or the rear surface plate 111) may not include some of the first regions 110D (or of the second regions 110E).

In yet another embodiment, when viewed from the side surface of the electronic device 101, the side surface bezel structure 118 may have a first thickness (or width) in a side surface direction (e.g., a short side) in which the first regions 110D or the second regions 110E as described above are not included, and may have a second thickness smaller than the first thickness in a side surface direction (e.g., a long side) in which the first regions 110D or the second regions 110E are included.

Figure 5:
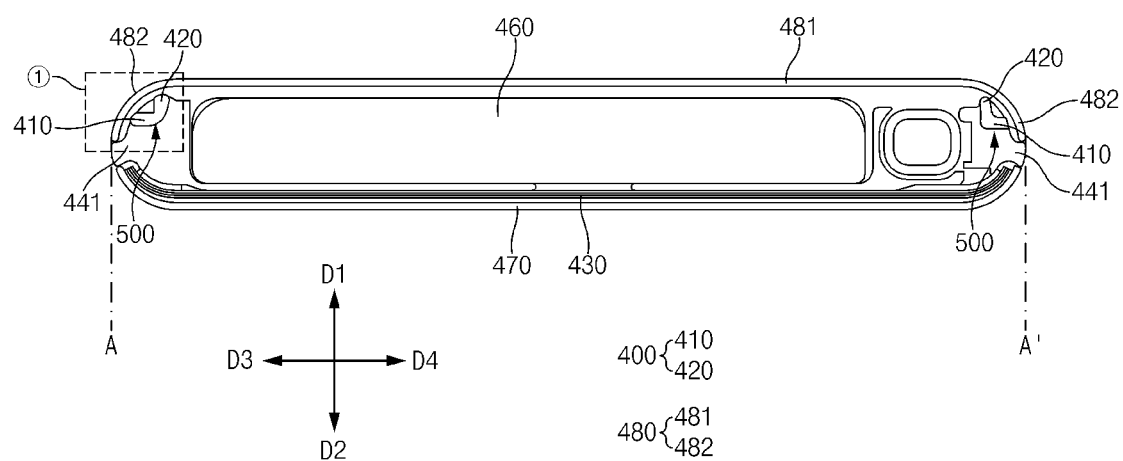
FIG. 5 is a cross-sectional view of an electronic device, taken along line A-A' of FIG. 4 according to an embodiment of the disclosure.

In yet another embodiment, the electronic device 101 may include at least one of a display 106, audio modules 103 and 107 (e.g., an audio module 570 in FIG. 5), a sensor module (not shown) (e.g., a sensor module 576 in FIG. 5), camera modules 105, 112, and 113 (e.g., a camera module 580 in FIG. 5), a key input device 117 (e.g., an input module 550 in FIG. 5), a light emitting device (not shown), and a connector hole 108 (e.g., a connecting terminal 578 in FIG. 5). In yet another embodiment, the electronic device 101 may omit at least one (e.g., the key input device 117 or the light emitting device (not shown)) of the components or additionally include other components.

In yet another embodiment, the display 106 may be exposed through a substantial portion of the front surface plate 102. For example, at least a portion of the display 106 may be exposed through the front surface plate 102 including the first surface 110A and the first regions 110D of the side surface 110C.

In yet another embodiment, an edge of the display 106 may be formed to have a shape that is substantially the same as a shape of an adjacent outer periphery of the front surface plate 102. In yet another embodiment (not shown), a distance between an outer periphery of the display 106 and the outer periphery of the front surface plate 102 may be substantially constant to expand an area to which the display 106 is exposed.

In yet another embodiment, a surface (or the front surface plate 102) of the housing 110 may include a screen display region defined as the display 106 is visually exposed. For example, the screen display region may include the first surface 110A and the first regions 110D of the side surface.

In yet another embodiment (not shown), the screen display region 110A and 110D may include a sensing region (not shown) for acquiring biometric information of a user. In this connection, "the screen display region 110A and 110D includes the sensing region" may be understood to mean that at least a portion of the sensing region may overlap the screen display region 110A and 110D. For example, the sensing region (not shown) may mean a region that may display visual information by the display 106 like other regions of the screen display region 110A and 110D, and additionally acquire the biometric information (e.g., a fingerprint) of the user.

In yet another embodiment, the screen display region 110A and 110D of the display 106 may include a region in which the first camera module 105 (e.g., a punch hole camera) may be visually exposed. For example, at least a portion of an edge of the region in which the first camera module 105 is exposed may be surrounded by the screen display region 110A and 110D. In yet another embodiment, the first camera module 105 may include a plurality of camera modules (e.g., the camera module 580 in FIG. 5).

In yet another embodiment (not shown), the display 106 may be coupled to or disposed adjacent to a touch sensing circuit, a pressure sensor capable of measuring an intensity (a pressure) of a touch, and/or a digitizer that detects a magnetic field-type stylus pen.

In yet another embodiment, the audio modules 103, 104, and 107 may include the microphone holes 103 and 104 and the speaker hole 107.

In yet another embodiment, the microphone holes 103 and 104 may include the first microphone hole 103 defined in a region of the side surface 110C and the microphone hole 104 defined in a region of the second surface 110B. In the microphone holes 103 and 104, a microphone for acquiring an external sound may be disposed. The microphone may include a plurality of microphones to sense a direction of the sound. In yet another embodiment, the second microphone hole 104 defined in the region of the second surface 110B may be disposed adjacent to the camera modules 105, 112, and 113. For example, the second microphone hole 104 may acquire the sound when the camera modules 105, 112, and 113 are executed, or acquire the sound when another function is executed.

In yet another embodiment, the speaker hole 107 may include the external speaker hole 107 and a receiver hole (not shown) for a call. The external speaker hole 107 may be defined in a portion of the side surface 110C of the electronic device 101. In yet another embodiment, the external speaker hole 107 may be implemented as one hole with the microphone hole 103. Although not shown, the receiver hole (not shown) for the call may be defined in another portion of the side surface 110C. For example, the receiver hole (not shown) for the call may be defined in another portion (e.g., a portion on a +Y-axis side) of the side surface 110C facing away from the portion (e.g., a portion on a −Y-axis side) of the side surface 110C in which the external speaker hole 107 is defined.

In yet another embodiment, the electronic device 101 may include a speaker in communication with the speaker hole 107. In yet another embodiment, the speaker may include a piezo speaker in which the speaker hole 107 is omitted.

In yet another embodiment, the sensor module (not shown) (e.g., the sensor module 576 in FIG. 5) may generate an electrical signal or a data value corresponding to an internal operating state or an external environmental state of the electronic device 101. For example, the sensor module may include at least one of a proximity sensor, a HRM sensor, a fingerprint sensor, a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, and an illuminance sensor.

In yet another embodiment, the camera modules 105, 112, and 113 may include the first camera module 105 (e.g., the punch hole camera) exposed from the first surface 110A of the electronic device 101, and the second camera module 112 and/or the flash 113 exposed through the second surface 110B.

In yet another embodiment, the first camera module 105 may be exposed through a portion of the screen display region 110A and 110D of the display 106. For example, the first camera module 105 may be exposed from a region of the screen display region 110A and 110D through an opening (not shown) defined in a portion of the display 106.

In yet another embodiment, the second camera module 112 may include a plurality of camera modules (e.g., a dual camera, a triple camera, or a quad camera). However, the second camera module 112 may not be necessarily limited to including the plurality of camera modules, and may include one camera module.

Each of the first camera module 105 and the second camera module 112 may include one or a plurality of lenses, an image sensor, and/or an image signal processor. The flash 113 may include, for example, a light emitting diode or a xenon lamp. In yet another embodiment, two or more lenses (an infrared camera, and wide-angle and telephoto lenses) and image sensors may be disposed on one surface of the electronic device 101.

In yet another embodiment, the key input device 117 may be disposed on the side surface 110C (e.g., in the first regions 110D and/or the second regions 110E) of the housing 110. In yet another embodiment, the electronic device 101 may not include a portion or an entirety of the key input device 117, and the key input device 117 that is not included may be implemented in another form, like a soft key, on the display 106. In yet another embodiment, the key input device may include a sensor module (not shown) that forms the sensing region (not shown) included in the screen display region 110A and 110D.

In yet another embodiment, the connector hole 108 may receive a connector. The connector hole 108 may be disposed on the side surface 110C of the housing 110. For example, the connector hole 108 may be disposed on the side surface 110C to be adjacent to at least a portion of the audio module (e.g., the microphone hole 103 and the speaker hole 107). In yet another embodiment, the electronic device 101 may include the first connector hole 108 capable of accommodating a connector (e.g., a universal serial bus (USB) connector) for transmitting/receiving power and/or data with an external device and/or a second connector hole (not shown) capable of accommodating a connector (e.g., an earphone jack) for transmitting/receiving an audio signal with the external device.

In yet another embodiment, the electronic device 101 may include the light emitting device (not shown). For example, the light emitting device (not shown) may be disposed on the first surface 110A of the housing 110. The light emitting device (not shown) may provide state information of the electronic device 101 in a form of light. In yet another embodiment, the light emitting device (not shown) may provide a light source that is in association with an operation of the first camera module 105. For example, the light emitting device (not shown) may include a light emitting diode (LED), an infrared (IR) LED, and/or a xenon lamp.

In yet another embodiment, at least a portion of the side surface bezel structure 118 may function as an antenna electrically connected to the communication module. According to an embodiment, the side surface bezel structure 118 may include a conductive part 202 formed of a metal material and a division part 201 formed of a nonmetal material (e.g., a polymer). According to yet another embodiment, at least a portion of the conductive part 202 may be a radiator, for example, an antenna that is electrically connected to the communication module and radiates an RF signal output from the communication module.

Figure 3:
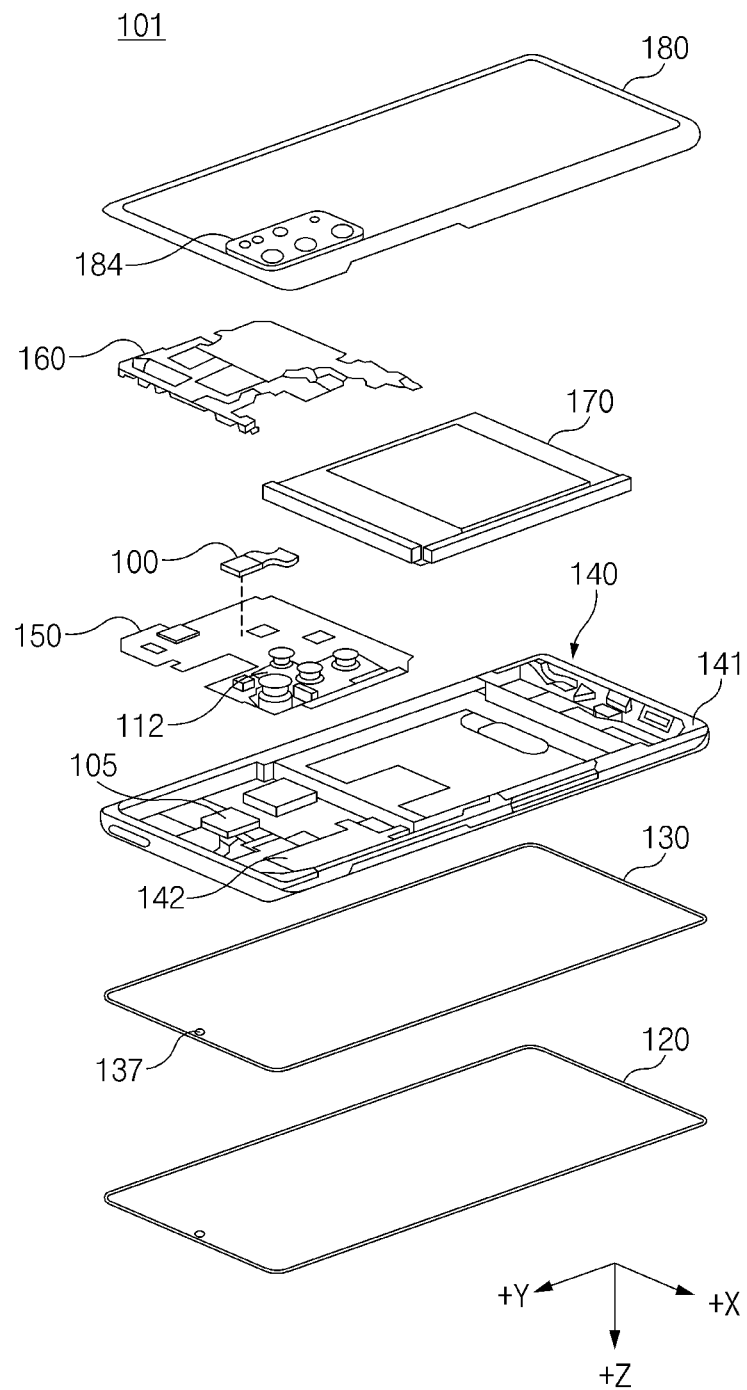
FIG. 3 illustrates an exploded perspective view illustrating an electronic device according to an embodiment of the disclosure.

FIG. 3 is an exploded perspective view of an electronic device according to an embodiment of the disclosure.

Referring to FIG. 3, the electronic device 101 may include a front surface plate 120 (e.g., the front surface plate 102 in FIG. 1), a display 130 (e.g., the display 106 in FIG. 1), a bracket 140, a battery 170, a printed circuit board (PCB) 150, a radio frequency printed circuit board (RFPCB) 100, a support member 160 (e.g., a rear casing), and a rear surface plate 180 (e.g., the rear surface plate 111 in FIG. 2).

In an embodiment, the electronic device 101 may omit at least one (e.g., the support member 160) of the components or additionally include other components. At least one of the components of the electronic device 101 may be the same as or similar to at least one of the components of the electronic device 101 in FIGS. 1 and 2. Hereinafter, redundant descriptions will be omitted.

In yet another embodiment, at least some of the front surface plate 120, the rear surface plate 180, and the bracket 140 (e.g., a frame structure 141) may form a housing (e.g., the housing 110 in FIGS. 1 and 2).

In yet another embodiment, the bracket 140 may include the frame structure 141 that forms a surface of the electronic device 101 (e.g., a portion of the side surface 110C in FIG. 1) and a plate structure 142 that extends inwardly of the electronic device 101 from the frame structure 141.

The plate structure 142 may be located inside the electronic device 101, connected to the frame structure 141, or integrally formed with the frame structure 141. The plate structure 142 may be made of, for example, a metallic material and/or a non-metallic (e.g., polymer) material. The display 130 may be coupled to one surface of the plate structure 142 and the PCB 150 may be coupled to the other surface of the plate structure 142. A processor, a memory, and/or an interface may be mounted on the PCB 150. The processor may include, for example, one or more of a central processing unit, an application processor, a graphics processing device, an image signal processor, a sensor hub processor, and a communication processor.

The memory may include, for example, a volatile memory or a non-volatile memory.

The interface may include, for example, a high definition multimedia interface (HDMI), a universal serial bus (USB) interface, a secure digital (SD) card interface, and/or an audio interface. The interface may, for example, electrically or physically connect the electronic device 101 to the external device, and may include a USB connector, an SD card/multimedia card (MMC) connector, or an audio connector.

In yet another embodiment, the battery 170 may supply power to at least one of the components of the electronic device 101. For example, the battery 170 may include a non-rechargeable primary cell, a rechargeable secondary cell, or a fuel cell. In yet another embodiment, at least a portion of the battery 170 may be disposed substantially coplanar with the PCB 150. In yet another embodiment, the battery 170 may be integrally disposed inside the electronic device 101 or may be disposed detachably from the electronic device 101.

In yet another embodiment, the first camera module 105 may be disposed on the plate structure 142 of the bracket 140 such that the lens thereof is exposed from a region of the front surface plate 120 (e.g., the front surface 110A in FIG. 1) of the electronic device 101.

In yet another embodiment, the first camera module 105 may be disposed such that an optical axis of the lens thereof is at least partially aligned with a hole or recess 137 defined in the display 130. For example, the region from which the lens is exposed may be formed on the front surface plate 120. For example, the first camera module 105 may include the punch hole camera having at least a portion disposed inside the hole or recess 137 defined in a rear surface of the display 130.

In yet another embodiment, the second camera module 112 may be disposed on the PCB 150 such that the lens thereof is exposed from a camera region 184 of the rear surface plate 180 (e.g., the rear surface 110B in FIG. 2) of the electronic device 101.

In yet another embodiment, the camera region 184 may be formed on a surface (e.g., the rear surface 110B in FIG. 2) of the rear surface plate 180. In yet another embodiment, the camera region 184 may be formed to be at least partially transparent such that external light is incident to the lens of the second camera module 112. In yet another embodiment, at least a portion of the camera region 184 may protrude from the surface of the rear surface plate 180 with a predetermined height. However, the disclosure may not be necessarily limited thereto, and the camera region 184 may be substantially coplanar with the surface of the rear surface plate 180.

The electronic device 101 according to various embodiments may include an electronic device, such as a bar type, a foldable type, a rollable type, a sliding type, a wearable type, a tablet personal computer (PC), and/or a notebook PC. The electronic device 101 according to various embodiments of the disclosure is not limited to the above-described example, and may include other various electronic devices.

Figure 4:
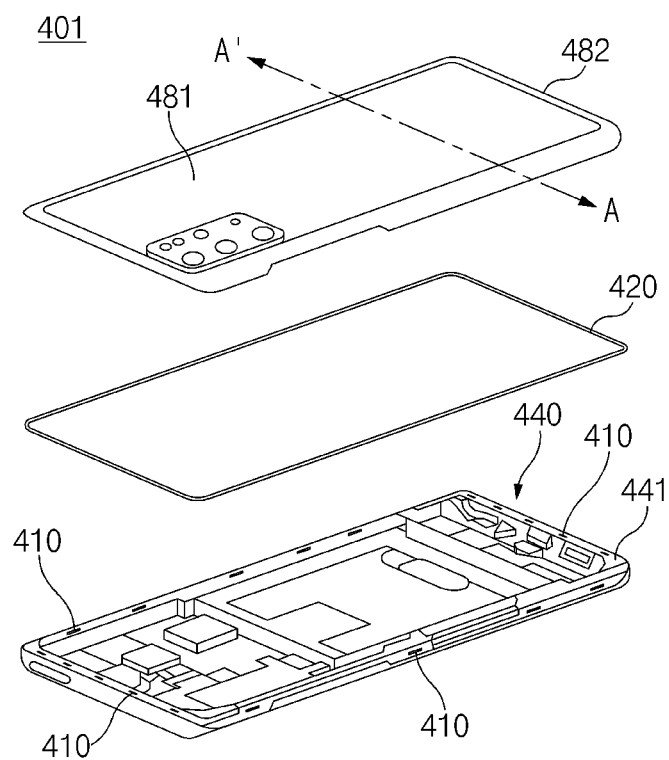
FIG. 4 is an exploded perspective view illustrating a joining structure between a rear plate and a housing of an electronic device according to an embodiment of the disclosure.

FIG. 4 is an exploded perspective view illustrating a joining structure between a rear plate and a housing of an electronic device according to an embodiment of the disclosure.

FIG. 5 is a cross-sectional view of an electronic device, taken along line A-A' of FIG. 4 according to an embodiment of the disclosure.

Referring to FIGS. 4 and 5, an electronic device 401 (e.g., the electronic device 101 of FIGS. 1 to 3) disclosed in the disclosure may include a housing 440 (e.g., the bracket 140 of FIG. 3) including a side member 441 (e.g., the frame structure 141 of FIG. 3), a rear plate (or a first plate) 480 (e.g., the rear plate 180 of FIG. 3), a front plate (or a second plate) 470 (e.g., the front surface plate 120 of FIG. 3), and an adhesion member 400.

At least a portion of the rear plate 480 may be a curved surface. The rear plate 480 may include a flat area 481 that faces a first direction (e.g., direction D1), and a curved area 482 that extends from the flat area 481 to form a curved surface.

The flat area 481 may be a central area of the rear plate 480, and the curved area 482 may be formed at an edge area of the rear plate 480 with respect to the flat area 481. The curved area 482 may have a curved structure that is curved seamlessly toward a second direction (e.g., direction D2) that faces a display 430 (e.g., the display 130 of FIG. 3). According to an embodiment, the curved area 482 may have a closed loop shape that surrounds the flat area 481. For example, four curved areas 482 may be formed when the flat area 482 has a rectangular shape. According to another embodiment, the plurality of curved areas 482 may extend from a partial area of the flat area 481 to face each other. The curved areas 482 may not be formed at opposite ends of the rear plate 480, which are located along a widthwise direction (e.g., the X direction of FIG. 3) thereof, and may be formed at opposite ends thereof, which are located along a lengthwise direction (e.g., the Y direction of FIG. 3). Some of the curved areas 482 may be formed by bending a left area of the rear plate 480 with respect to the flat area 481. The remaining ones of the curved area 482 may be formed by bending a right area of the rear plate 480 with respect to the flat area 481.

The rear plate 480 may have a plurality of layers. For example, one surface (e.g., a surface that faces direction D1) of the rear plate, which faces an outside of the electronic device 401, for example, may be formed of coated or colored glass, ceramic, a polymer, a metal (e.g., aluminum, stainless steel, or magnesium), or a combination of at least two thereof. An opposite surface (e.g., a surface that faces direction D2) of the rear plate 480, which faces an inside of the electronic device 401, may have various printed layers.

The front plate 470 may face the second direction (e.g., direction D2) that is an opposite direction to the first direction (e.g., direction DD). The electronic device 401 may define an interior space between the front plate 470 and the rear plate 480. At least a portion of the front plate 470 may be a curved surface. A battery 460 and the display 430 may be accommodated in the interior space between the front plate 470 and the rear plate 480.

The housing 440 may be formed of plastic, a metal (e.g., aluminum, stainless steel, or magnesium), a combination of plastic or glass fiber, or a combination of at least two of the materials. The plastic, for example, may be formed of polycarbonate (PC), polyamide (PA), polybutylene terephthalate (PBT), or a combination of at least two of the materials.

The side member 441 and the rear plate 480 of the housing 440 may be coupled to each other by the adhesion member 400. The adhesion member 400 may include a first adhesion member 410 and a second adhesion member 420. The side member 441 and the rear plate 480 of the housing 440 may be coupled to each other by at least any one of the first adhesion member 410 and the second adhesion member 420.

A plurality of first adhesion members 410 may be disposed in the side member 441 of the housing 440. Each of the plurality of first adhesion members 410 may be formed in a dot form to be spaced apart from an adjacent first adhesion member 410. The plurality of first adhesion members 410 may be filled in adhesion tunnels 500 formed in the side member 441. The plurality of adhesion tunnels 500 may correspond to the plurality of first adhesion members 410 in one-to-one correspondence.

When the rear plate 480 is viewed from a top, the second adhesion members 420 may be formed along a periphery of at least any one of the rear plate 480 and the side member 441. The second adhesion members 420 may be formed in a closed curve form. The second adhesion member 420 may be attached to the side member 441, and may couple the rear plate 480 and the side member 441 by pressing the side member 441 and the rear plate 480.

Figure 6A:
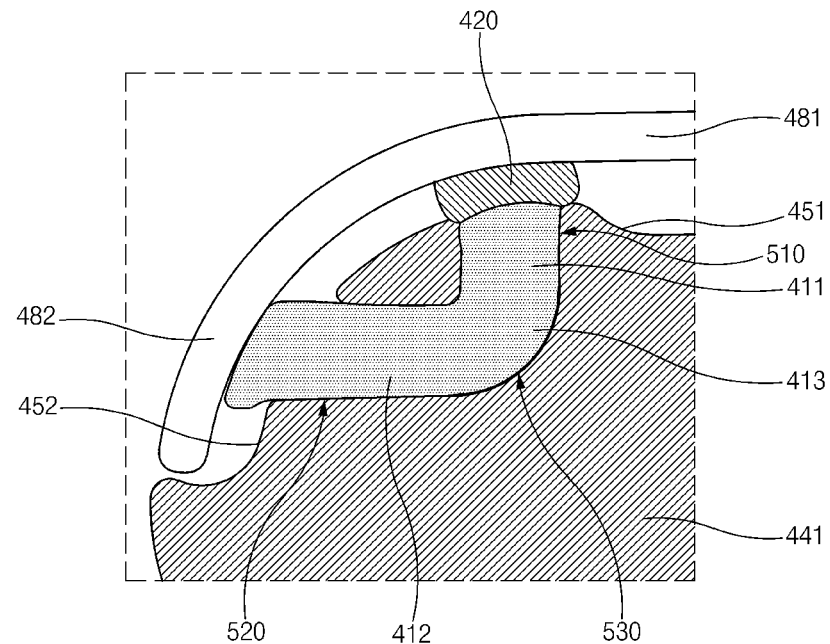
FIGS. 6A and 6B are cross-sectional views illustrating various embodiments, in which area ① of FIG. 5 is enlarged according to various embodiments of the disclosure.
Figure 6A:
Figure 6B:
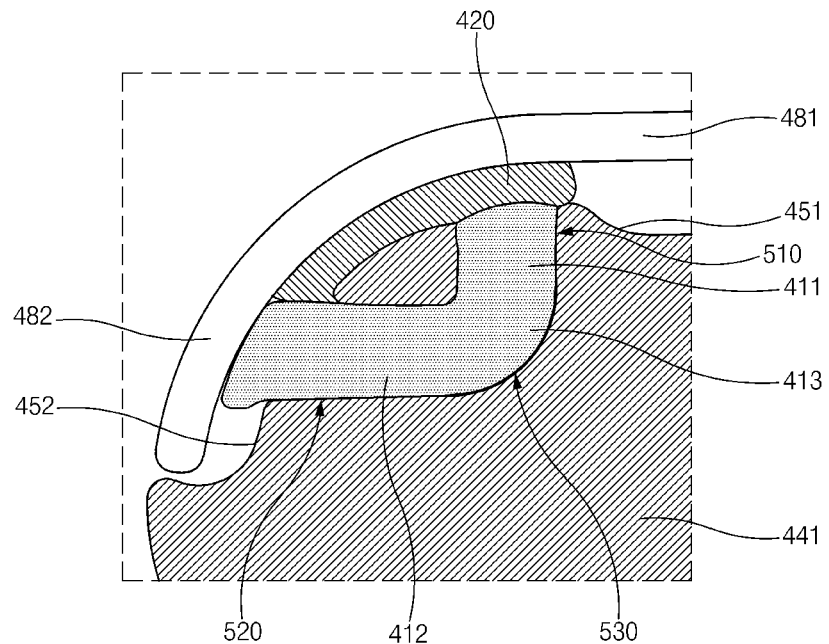
Figure 6B:
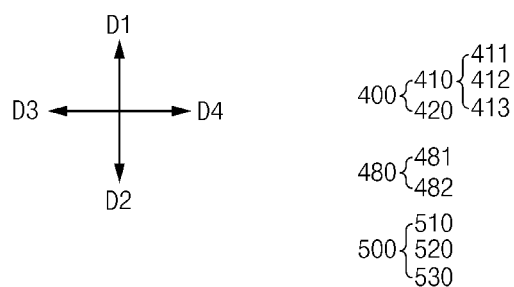

FIGS. 6A and 6B are cross-sectional views illustrating various embodiments, in which area ① of FIG. 5 is enlarged according to various embodiments of the disclosure.

Referring to FIGS. 6A and 6B, an electronic device (e.g., the electronic device 401 of FIG. 4) disclosed in the disclosure may include the side member 441 including the plurality of adhesion tunnels 500, the first adhesion member 410, and the second adhesion member 420.

The side member 441 may include the plurality of adhesion tunnels 500. Each of the plurality of adhesion tunnels 500 may be formed to pass through the side member 441 from a first outer surface 451 to a second outer surface 452 of the side member 441. The plurality of adhesion tunnels 500 may include a first hole area 510 (or an injection hole), a second hole area 520 (or a discharge hole), and a connection area 530.

The first hole area 510 may be opened toward the flat area 481 of the rear plate 480. The first hole area 510 may be formed to extend from the first direction D1 that is a rearward direction to the second direction D2 that is a forward direction. The first hole area 510 may be formed to overlap the flat area 481 of the rear plate 480 and to pass through the first outer surface 451. The first hole area 510 may be formed to pass through a portion of the side member 441 from the first outer surface 451 of the side member 441, which faces the flat area 481 of the rear plate 480, in the second direction D2.

The second hole area 520 may be opened toward the curved area 482 of the rear plate 480. The second hole area 520 may be formed to extend from any one of a third direction D3 and a fourth direction D4, which are substantially perpendicular to or crosses the first direction D1, to the remaining one of the third direction D3 and the fourth direction D4. The second hole area 520 may be formed to overlap the curved area 482 of the rear plate 480 and to pass through the second outer surface 452. The second hole area 520 may be formed to pass through a portion of the side member 441 from the second outer surface 452 of the side member 441, which faces the curved area 482 of the rear plate 480, in the third direction D3 or the fourth direction D4.

The connection area 530 may be disposed in a cross area of the first hole area 510 and the second hole area 520. The connection area 530 may spatially connect the first hole area 510 and the second hole area 520. Because the first hole area 510 and the second hole area 520 are connected to each other through the connection area 530, the adhesion tunnel 500 may be formed in an "L"-shaped tunnel structure that passes through a portion of the side member 441.

The first adhesion member 410 is filled in the adhesion tunnel 500, and thus may have a shape corresponding to the adhesion tunnel 500. For example, when the adhesion tunnel 500 has an "L" shape, at least a portion of the first adhesion member 410 may have an "L" shape along a shape of the adhesion tunnel 500. The first adhesion member 410 may include a first adhesion area 411 filled in the first hole area 510, a second adhesion area 412 filled in the second hole area 520, and a third adhesion area 413 filled in the connection area 530.

The second adhesion area 412 of the first adhesion member 410 may extend toward the curved area 482 of the rear plate 480 rather than toward the second outer surface 452 of the side member 441. The second adhesion area 412 of the first adhesion member 410 may be disposed between the curved area 482 of the rear plate 480 and the side member 441. The second adhesion area 412 of the first adhesion member 410 may couple the curved area 482 of the rear plate 480 and the side member 441. The first adhesion member 410 may contact the curved area 482 of the rear plate 480. A portion of the first adhesion member 410, which contacts the curved area 482 of the rear plate 480, may be formed in a curved form along the curved area 482.

The second adhesion member 420 may be disposed on the first adhesion member 410 filled in the first hole area 510. As an example, the second adhesion member 420, as illustrated in FIG. 6A, may be formed on the first adhesion area 411 of the first adhesion member 410 to have a width that is larger than that of the first adhesion area 411. The second adhesion member 420 may contact the flat area 481 of the rear plate 480. At least a portion of the second adhesion member 420, which contacts the flat area 481 of the rear plate 480, may be formed in a flat form along the flat area 481. As another example, the second adhesion member 420, as illustrated in FIG. 6B, may be formed on the first adhesion area 411 of the first adhesion member 410 toward the second adhesion area 412. The second adhesion member 420 may be formed on the second outer surface 452 of the side member 441, which is disposed between the first hole area 510 and the second hole area 520. The second adhesion member 420 may overlap the first adhesion area 411 and the second adhesion area 412 of the first adhesion member 410. The second adhesion member 420 may contact the first adhesion area 411 and the second adhesion area 412 of the first adhesion member 410.

According to an embodiment, the second adhesion member 420 may have an integral structure with no interface with the first adhesion member 410. According to another embodiment, the second adhesion member 420 may form an interface with the first adhesion member 410.

According to yet another embodiment, a coloring material or a fluorescent material may be added to at least any one of the first adhesion member 410 and the second adhesion member 420. For example, because the coloring material or the fluorescent material is added to the second adhesion member 420, an application defect or an adhesion defect of the second adhesion member 420 may be identified by naked eyes.

According to yet another embodiment, the second adhesion member 420 may be formed of a material that is the same as or dissimilar to the first adhesion member 410. At least any one of the first adhesion member 410 and the second adhesion member 420 may be formed of a liquid type adhesive. For example, the liquid type adhesive may be formed of a polyurethane (PUR) based material, an acryl based material, or a synthetic resin based material, or may be formed of a combination (e.g., a PUR+acryl based material or a PUR+synthetic resin based material) thereof. The PUR based material is a reactive adhesive that causes a reaction with a moisture, and a curing process may be performed in a space of designated temperature and humidity. The synthetic rubber based material is a non-reactive adhesive, and a curing process may be performed in a room-temperature space.

According to yet another embodiment, at least any one of the first adhesion member 410 and the second adhesion member 420 may be a pressure sensitive adhesive (PSHA). For example, at least any one of the first adhesion member 410 and the second adhesion member 420 may be pressure sensitive hot-melt adhesive (PSHA). At least any one of the first adhesion member 410 and the second adhesion member 420 may be a thermoplastic adhesive that is adhered through cool solidification after being heated and applied in a melted state. Because at least any one of the first adhesion member 410 and the second adhesion member 420 shows a bonding/adhesion performance even only with a cooling/solidification process, a separate additional process may be unnecessary. A softening point of at least any one of the first adhesion member 410 and the second adhesion member 420 may be 150 degrees (° C.) to 200 degrees (° C.) and they have a high heat-resistance maintaining force and a high viscosity, and thus stable application may be possible.

According to yet another embodiment, a main substance of at least any one of the first adhesion member 410 and the second adhesion member 420 may be a synthetic rubber based material or a plasticizer. The synthetic rubber based material is a thermoplastic rubber, of which a main substrate is a styrene block copolymer, and may be an adhesive that shows an adhesion performance by using a natural resin and a petroleum resin. The synthetic rubber based material is a solids-not-fat, and may not generate a toxic volatile organic compound (VOC), such as toluene, xylene, ethyl benzene, or styrene, including isocyanate. A mineral oil may be used for the plasticizer.

According to yet another embodiment, at least any one of the first adhesion member 410 and the second adhesion member 420 may formed as a pressure-sensitive adhesive, manufacturing costs of which are lower than that of a double-sided tape type adhesive, and thus costs may be saved. An embodiment including at least one of the first adhesion member 410 and the second adhesion member 420 may maintain a high adhesion force as compared with a comparative example including the double-sided tape type adhesive as in Table 1.

TABLE 1

| Adhesion force test environment | Comparative example | Embodiment |
|---|---|---|
| Room temperature | 10 kgf | 15 to 17 kgf |
| After high temperature/high humidity | | 12 to 15 kgf |
| After thermal impact | | |
| After low temperature | | |

According to yet another embodiment, after at least any one adhered object of the rear plate 480 and the side member 441 and the adhesion member 400 formed of a pressure-sensitive adhesive are disassembled, residuals of the adhesion member 400 may not be generated on the adhered object. The first adhesion member 410 and the second adhesion member 420 may be easily disassembled from at least any one of the rear plate 480 and the side member 441.

FIGS. 7A, 7B, 7C, and 7D are views illustrating an adhesion tunnel of an electronic device according to various embodiments of the disclosure.

Referring to FIGS. 7A to 7D, the adhesion tunnels 500 may include the first hole area 510, the second hole area 520, and the connection area 530.

The first hole area 510 may be formed to face an interior of the side member 441 from the first outer surface 451 of the side member 441. The first hole area 510 may be formed such that at least any one of a first transverse length W11 and a first longitudinal length W12 becomes wider as it becomes farther away from the connection area 530. The first transverse length W11 of the first hole area 510 may be equal to or larger than the first longitudinal length W12 of the first hole area 510. For example, the first transverse length W11 of the first hole area 510 may be 1.5 mm to 2.0 mm, and the first longitudinal length W12 of the first hole area 510 may be 1.0 mm to 1.5 mm.

The second hole area 520 may be formed to face an interior of the side member 441 from the second outer surface 452 of the side member 441. The second hole area 520 may be formed such that at least any one of a second transverse length W21 and a second longitudinal length W22 becomes wider as it becomes farther away from the connection area 530. The second transverse length W21 of the second hole area 520 may be equal to or larger than the second longitudinal length W22 of the second hole area 520. The second transverse length W21 of the second hole area 520 may be equal to or different from the first transverse length W11 of the first hole area 510. The second longitudinal length W22 of the second hole area 520 may be equal to or different from the first longitudinal length W12. For example, the second transverse length W21 of the second hole area 520 may be 1.5 mm to 2.0 mm, and the second longitudinal length W22 of the second hole area 520 may be 1.0 mm to 1.5 mm.

The first hole area 510 may be formed to be surrounded by a first inner surface 701, a second inner surface 702, a third inner surface 703, and a fourth inner surface 704. The first inner surface 701 may face the second inner surface 702 while the first hole area 510 being interposed therebetween. The first inner surface 701 may be formed to face an outside of the electronic device (e.g., the electronic device 401 of FIG. 4). The second inner surface 702 may be formed to face an inside of the electronic device. The third inner surface 703 may be connected to one side of the first inner surface 701 and one side of the second inner surface 702 therebetween. The fourth inner surface 704 may face the third inner surface 703 while the first hole area 510 being interposed therebetween. The fourth inner surface 704 may be connected to an opposite side of the first inner surface 701 and an opposite side of the second inner surface 702 therebetween.

The second hole area 520 may be formed to be surrounded by a fifth inner surface 705, a sixth inner surface 706, a seventh inner surface 707, and an eighth inner surface 708. The fifth inner surface 705 may face the sixth inner surface 706 while the second hole area 520 being interposed therebetween. The fifth inner surface 705 may be formed to face an outside of the electronic device. The sixth inner surface 706 may be formed to face an inside of the electronic device. The fifth inner surface 705 may be included in an extension area 442 of the side member 441, which extends toward the outside of the electronic device rather than toward the sixth inner surface 706 by a specific width WA. The width WA of the extension area 442 may be determined according to a curvature of the curved area 482 of the rear plate 480. The width WA of the extension area 442 may become smaller as the curvature of the curved area 482 becomes larger. The seventh inner surface 707 may be connected to one side of the fifth inner surface 705 and one side of the sixth inner surface 706 therebetween. The eighth inner surface 708 may face the seventh inner surface 707 while the second hole area 520 being interposed therebetween. The eighth inner surface 708 may be connected to an opposite side of the fifth inner surface 705 and an opposite side of the sixth inner surface 706 therebetween.

A width of the first hole area 510 may become larger as it goes farther away from the connection area 530. At least any one of the first inner surface 701, the second inner surface 702, the third inner surface 703, and the fourth inner surface 704 defined by the first hole area 510 may be formed to be inclined with respect to a first imaginary plane 751 and a second imaginary plane 752 that are substantially parallel to a center line that extends in a depth direction (e.g., D2) of the first hole area 510. Gradient angles defined by at least one of the first inner surface 701, the second inner surface 702, the third inner surface 703, and the fourth inner surface 704, and the imaginary planes 751 and 752 may be 0.5 to 1 degrees.

Figure 7A:
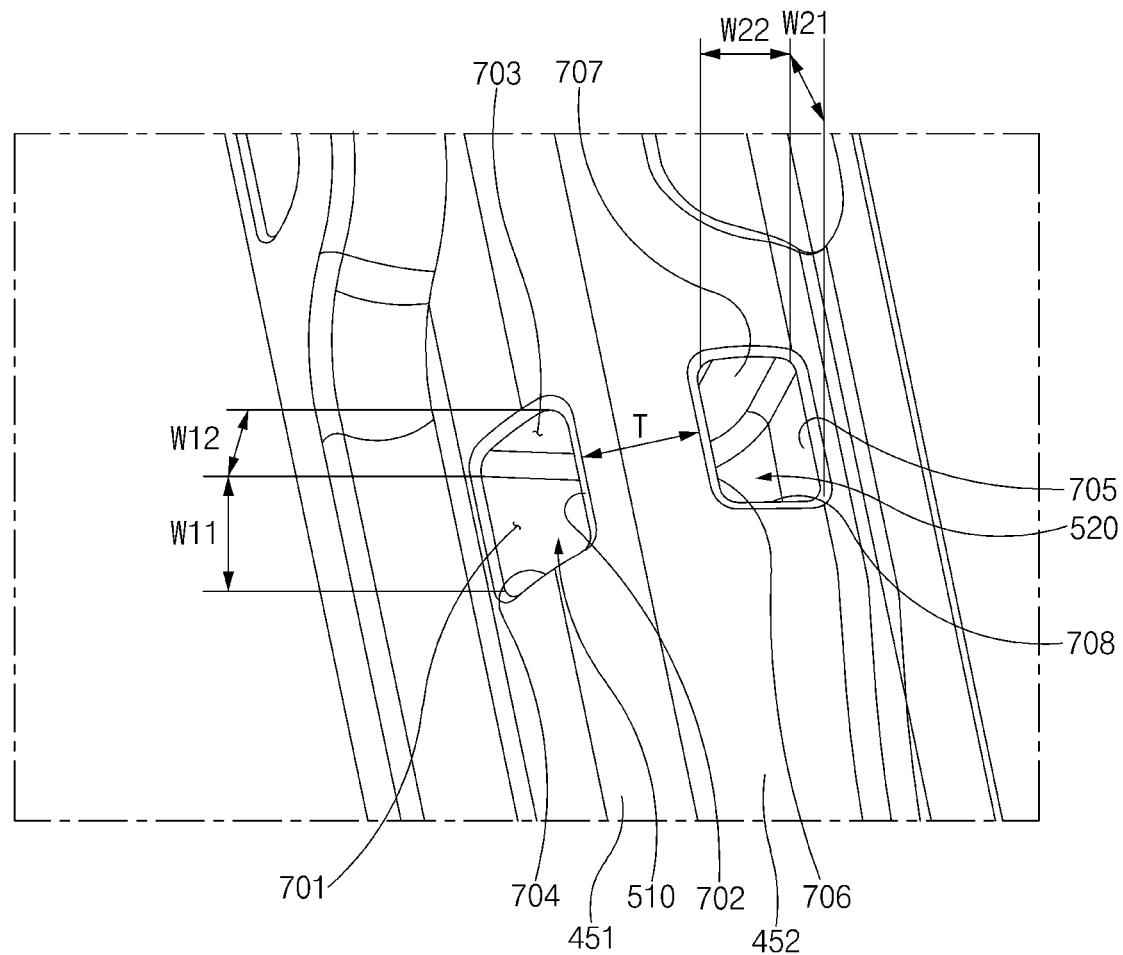
FIGS. 7A, 7B, 7C, and 7D are views illustrating an adhesion tunnel of an electronic device according to various embodiments of the disclosure.
Figure 7B:
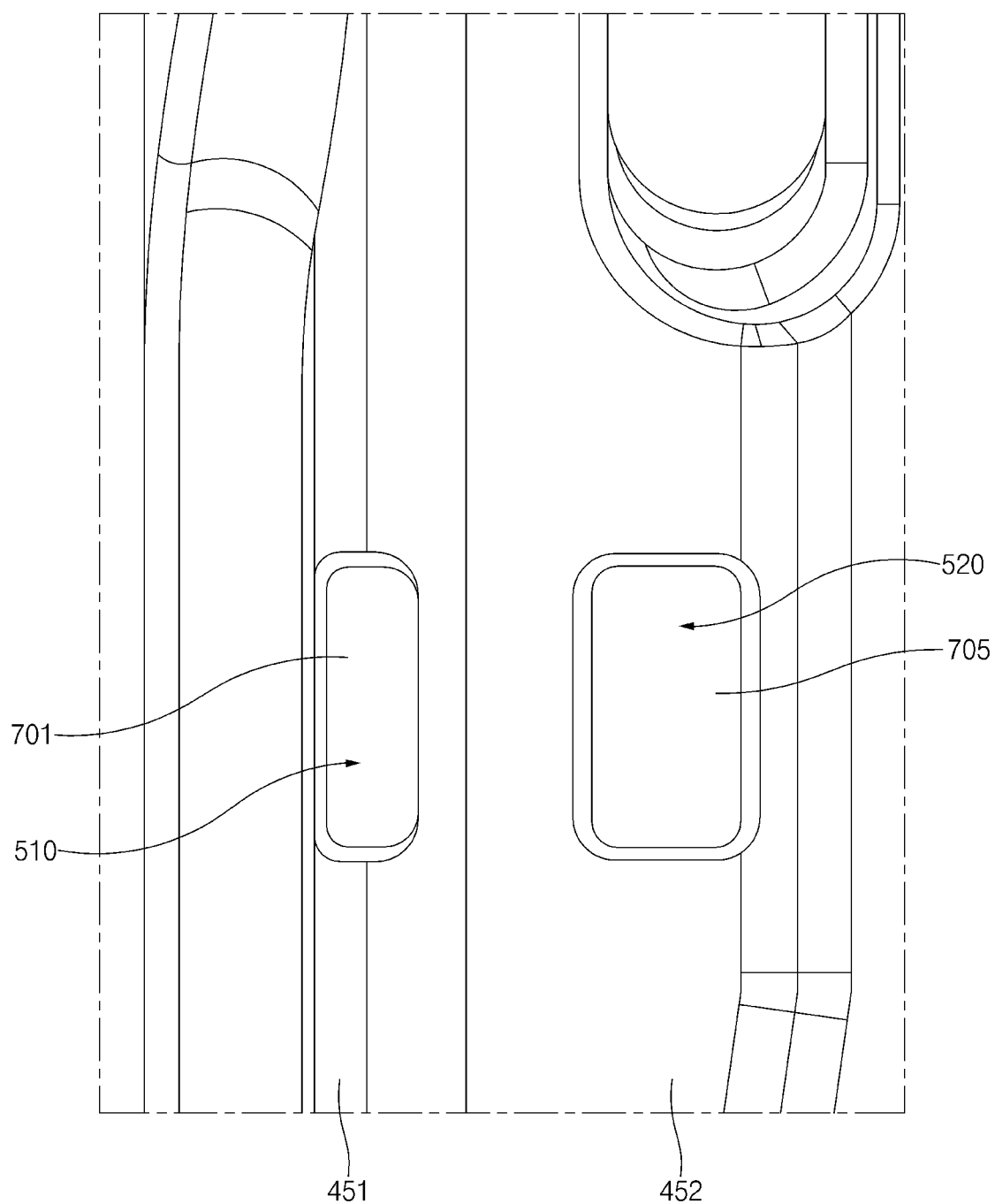
Figure 7C:
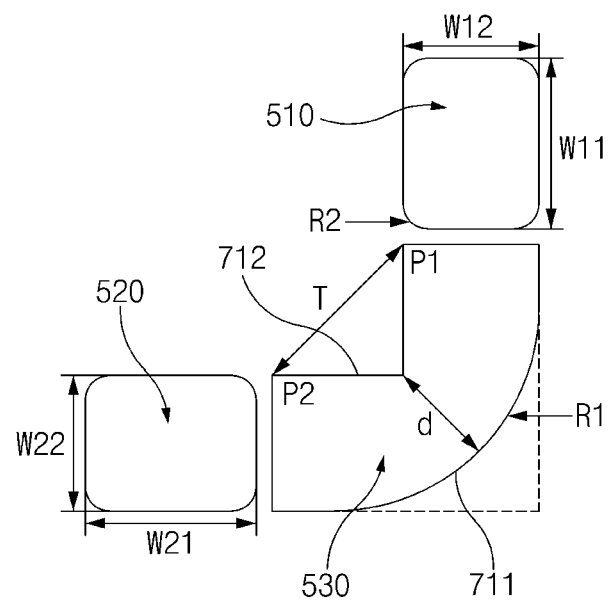
Figure 7D:
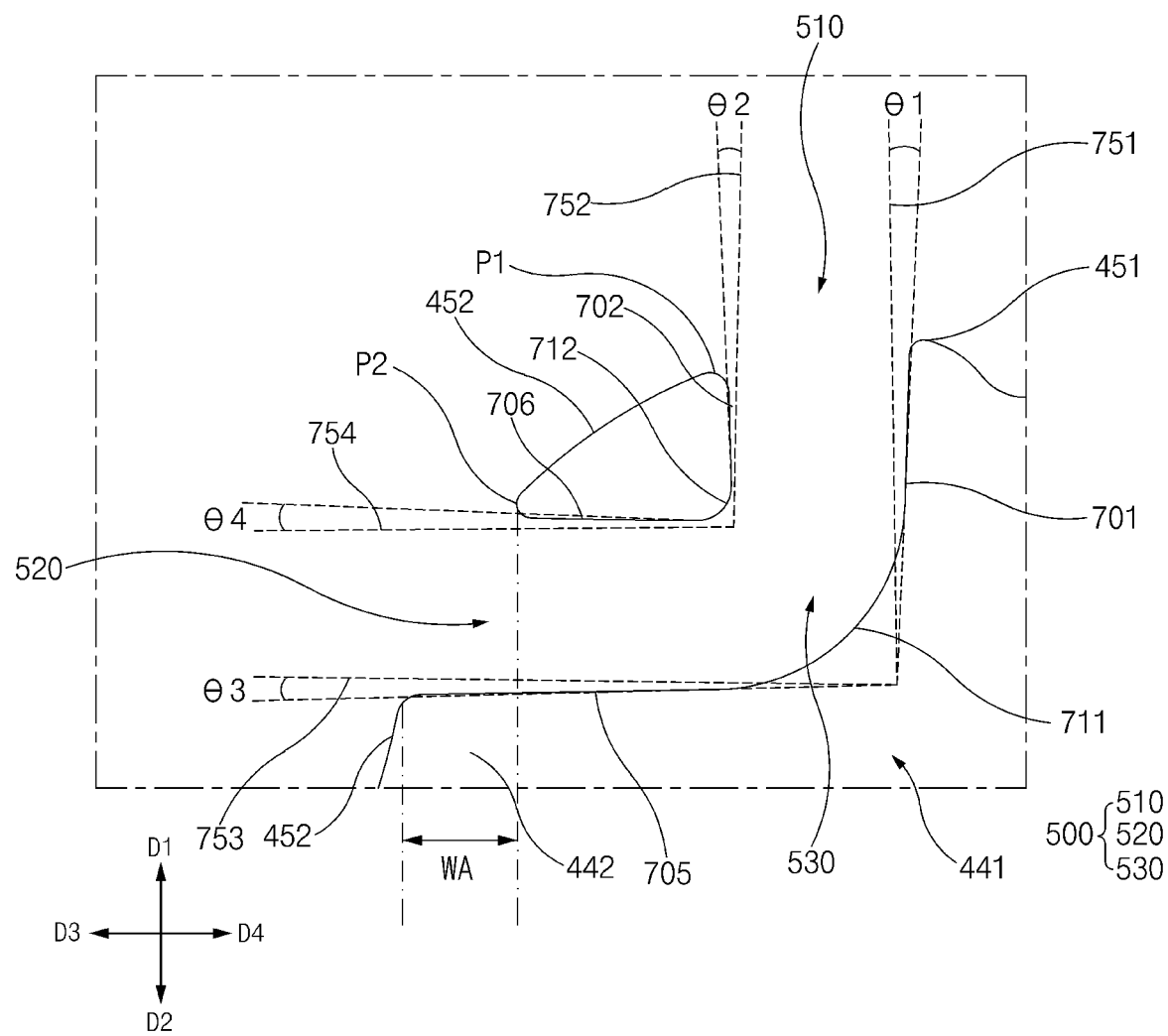

According to an embodiment, as illustrated in FIG. 7D, the first inner surface 701 may be formed to be inclined so as to become farther away from the second inner surface 702 as it becomes closer to the first outer surface 451. A first gradient angle θ1 defined by the first imaginary plane 751 located between the first inner surface 701 and the second inner surface 702, and the first inner surface 701 may be 0.5 to 1 degrees. The second inner surface 702 may be formed to be inclined so as to become farther away from the first inner surface 701 as it becomes closer to the first outer surface 451. A second gradient angle θ2 defined by the second imaginary plane 752 that is substantially parallel to the first imaginary plane 751, and the second inner surface 702 may be 0.5 to 1 degrees. The first gradient angle θ1 and the second gradient angle θ2 may be the same or different.

A width of the second hole area 520 may become larger as it goes farther away from the connection area 530. At least any one of the fifth inner surface 705, the sixth inner surface 706, the seventh inner surface 707, and the eighth inner surface 708 defined by the second hole area 520 may be formed to be inclined with respect to a third imaginary plane 753 and a fourth imaginary plane 754 that are substantially parallel to a center line that extends in a depth direction (e.g., D2) of the second hole area 520. Gradient angles defined by at least one of the fifth inner surface 705, the sixth inner surface 706, the seventh inner surface 707, and the eighth inner surface 708, and the imaginary planes 753 and 754 may be 0.5 to 1 degrees.

According to another embodiment, as illustrated in FIG. 7D, the fifth inner surface 705 may be formed to be inclined so as to become farther away from the sixth inner surface 706 as it becomes closer to the second outer surface 452. A third gradient angle θ3 defined by the third imaginary plane 753 that is substantially parallel to the first imaginary plane 751, and the fifth inner surface 705 may be 0.5 to 1 degrees. The sixth inner surface 706 may be formed to be inclined so as to become farther away from the fifth inner surface 705 as it becomes closer to the second outer surface 452. A fourth gradient angle θ4 defined by the fourth imaginary plane 754 that is substantially parallel to the second imaginary plane 752, and the sixth inner surface 706 may be 0.5 to 1 degrees. The third gradient angle θ3 and the fourth gradient angle θ4 may be the same or different.

The connection area 530 may define a plurality of inner corner surfaces 711 and 712 in the adhesion tunnels 500. The connection area 530 may include the first inner corner surface 711 and the second inner corner surface 712, which face each other. The first inner corner surface 711 may face the second inner corner surface 712 in a direction that faces the outside of the electronic device. The first inner corner surface 711 may connect the first inner surface 701 and the fifth inner surface 705, which face the outside of the electronic device. The second inner corner surface 712 may face the first inner corner surface 711 in a direction that faces the inside of the electronic device. The second inner corner surface 712 may connect the second inner surface 702 and the sixth inner surface 706, which face the inside of the electronic device.

Any one of the first inner corner surface 711 and the second inner corner surface 712 may be curved in a direction that defines an obtuse angle. A remaining one of the first inner corner surface 711 and the second inner corner surface 712 may be curved in a direction that defines an acute angle, a right angle, or an obtuse. The first inner corner surface 711 may be curved in a direction that defines an obtuse angle so as not to be an obstruction to a flow direction (e.g., discharged from the first hole area to the second hole area) of the liquid type adhesive that constitutes the first adhesion member 410. For example, the first inner corner surface 711 may be curved in a direction that defines an obtuse angle to be formed in a curved form, and the second inner corner surface 712 may be curved in a direction that defines a right angle. As another example, the first inner corner surface 711 and the second inner corner surface 712, as illustrated in FIG. 7D, may be curved in a direction that defines an obtuse angle to be formed in a curved form.

A spacing distance "d" between the first inner corner surface 711 and the second inner corner surface 712 may be formed to be smaller than at least any one of the first transverse length W11, the second transverse length W21, the first longitudinal length W12, and the second longitudinal length W22. The spacing distance "d" between the first inner corner surface 711 and the second inner corner surface 712 may be formed to have a size that is large not to obstruct a flow direction (e.g., a flow from the first hole area 510 to the second hole area 520) of the liquid type adhesive that constitutes the first adhesion member 410. The spacing distance "d" between an apex of the first inner corner surface 711 and an apex of the second inner corner surface 712 may be a minimum of 0.5 mm or more. For example, the spacing distance "d" between the apex of the first inner corner surface 711 and the apex of the second inner corner surface 712 may be 0.9 mm to 1.1 mm.

According to yet another embodiment, a center of a radius of curvature of the first inner corner surface 711 and a center of a radius of curvature of the second inner corner surface 712 may be located at the same location. A radius R1 of curvature of the first inner corner surface 711 may be larger than a radius of curvature of the second inner corner surface 712. The radius of curvature of the first inner corner surface 711 may be larger than the radius R2 of curvature of at least any one of the first hole area 510 and the second hole area 520. For example, the first inner corner surface 711 may have the radius R1 of curvature of 0.9 to 1.1.

A minimum thickness "T" of the side member 441 that surrounds the adhesion tunnel 500 may be designed in consideration of a strength that is high enough not to be damaged when the side member 441 contacts the first adhesion member 410, the second adhesion member 420, and the rear plate 480. The minimum thickness "T" of the side member 441 may correspond to a distance between a first apex P1 between the second inner surface 702 and the second outer surface 452, and a second apex P2 between the sixth inner surface 706 and the second outer surface 452. For example, the thickness "T" of the side member 441 may be a minimum of 0.6 mm to 0.8 mm.

Figure 8A:
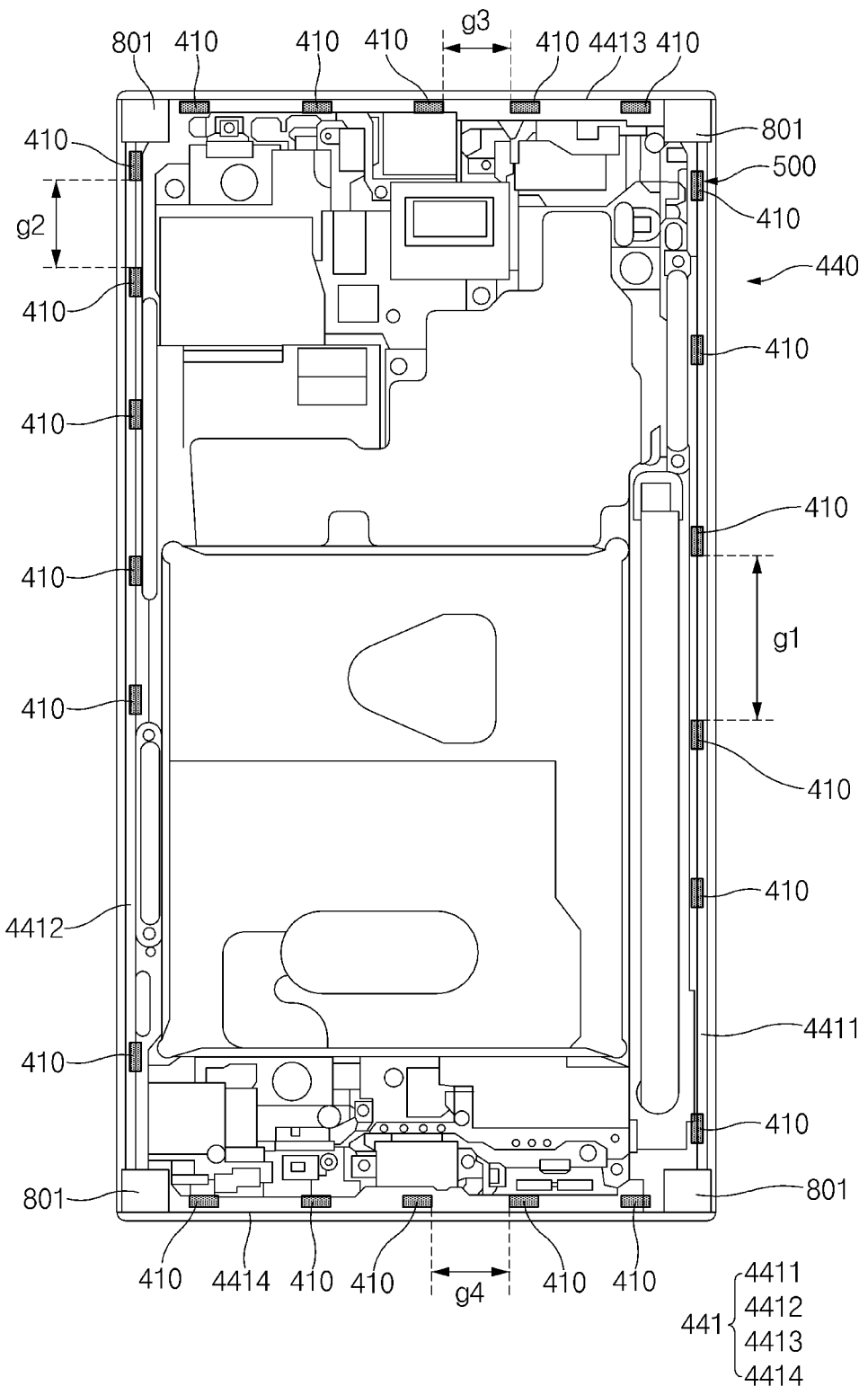
FIGS. 8A and 8B are views illustrating a first adhesion member and a second adhesion member of an electronic device according to various embodiments of the disclosure.
Figure 8B:
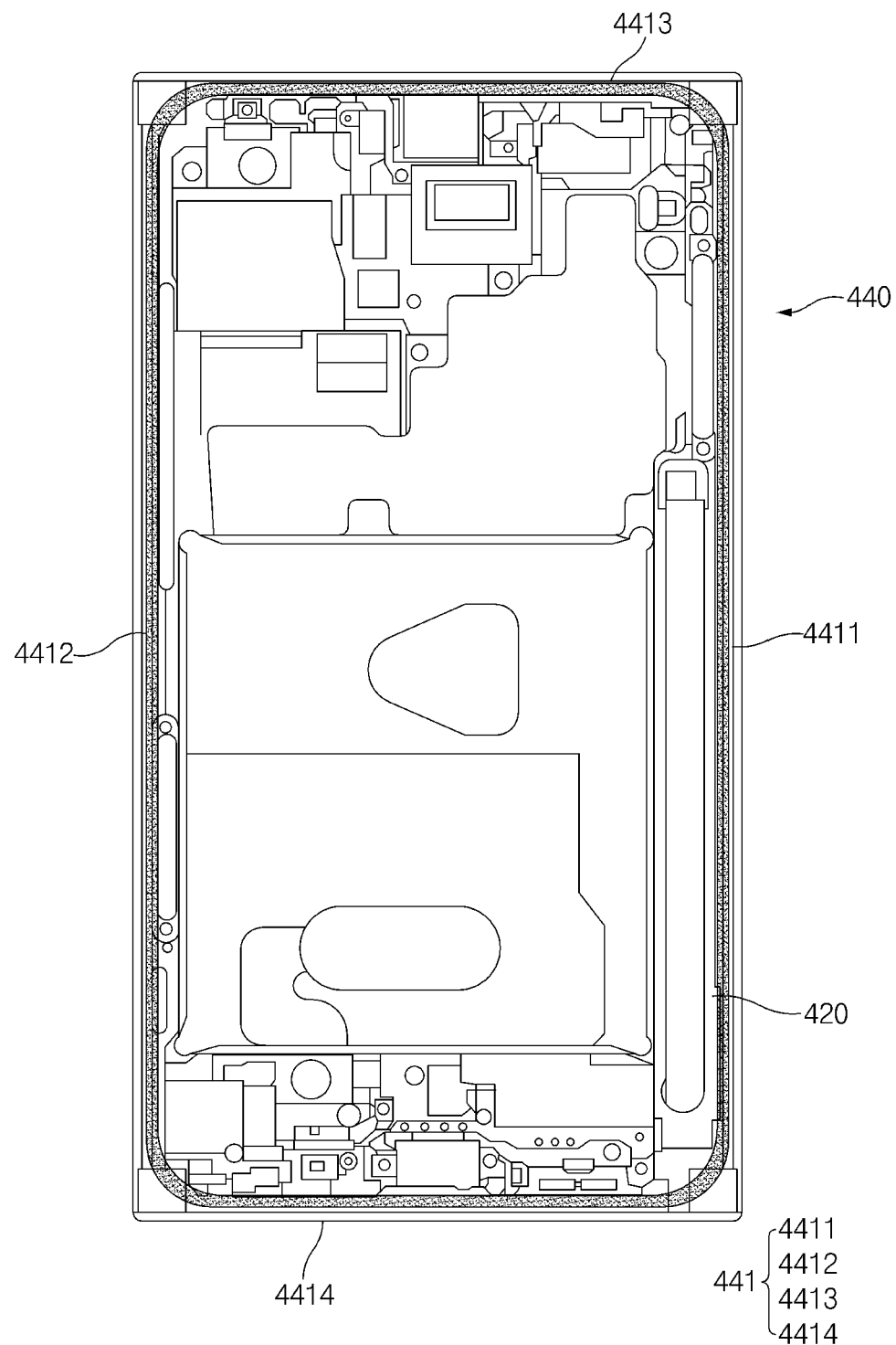

FIGS. 8A and 8B are views illustrating a first adhesion member and a second adhesion member of an electronic device according to various embodiments of the disclosure.

Referring to FIGS. 8A and 8B, when the first adhesion member 410 filled in the side member 441 is viewed from a top, the first adhesion member 410 may be implemented in a circular shape, an elliptical shape, a polygonal shape, or a polygonal shape having rounded corners. The first adhesion member 410 may be implemented in various shapes and structures, and a shape, a structure, and the number of the first adhesion members 410 are neither restricted nor limited in the disclosure.

The plurality of first adhesion members 410 may be formed in the side member 441 of the housing 440. For example, one first adhesion member 410, as illustrated in FIG. 8A, may be formed in each of a right area 4411, a left area 4412, an upper area 4413, and a lower area 4414 of the side member 441.

Each of the plurality of first adhesion members 410 disposed in the right area 4411 of the side member 441 may be disposed to be spaced apart from an adjacent first adhesion member 410 by a specific first gap g1. Each of the plurality of first adhesion members 410 disposed in the left area 4412 of the side member 441 may be disposed to be spaced apart from an adjacent first adhesion member 410 by a specific second gap g2. Each of the plurality of first adhesion members 410 disposed in the upper area 4413 of the side member 441 may be disposed to be spaced apart from an adjacent first adhesion member 410 by a specific third gap g3. Each of the plurality of first adhesion members 410 disposed in the lower area 4414 of the side member 441 may be disposed to be spaced apart from an adjacent first adhesion member 410 by a specific fourth gap g4. The first gap g1, the second gap g2, the third gap g3, and the fourth gap g4 may have the same or different sizes. At least any one of the first gap g1, the second gap g2, the third gap g3, and the fourth gap g4 may be maintained at a minimum of 10 mm or more. For example, at least any one of the first gap g1, the second gap g2, the third gap g3, and the fourth gap g4 may be maintained at 10 mm to 15 mm.

A corner area 801 of the side member 441 may be thicker than the remaining areas of the side member 441, except for the corner area 801, and thus it may be relatively difficult to form the adhesion tunnels 500. The adhesion tunnels 500 may be formed in the remaining areas of the side member 441, except for the corner area 801. The first adhesion member 410 may be filled in the adhesion tunnels 500 formed in the remaining areas of the side member 441, except for the corner area 801.

The second adhesion member 420 may be formed on at least any one of the right area 4411, the left area 4412, the upper area 4413, and the lower area 4414 of the side member 441. The second adhesion member 420 may be formed on the side member 441 filled with the first adhesion member 410 along a circumference of the side member 441.

Figure 9:
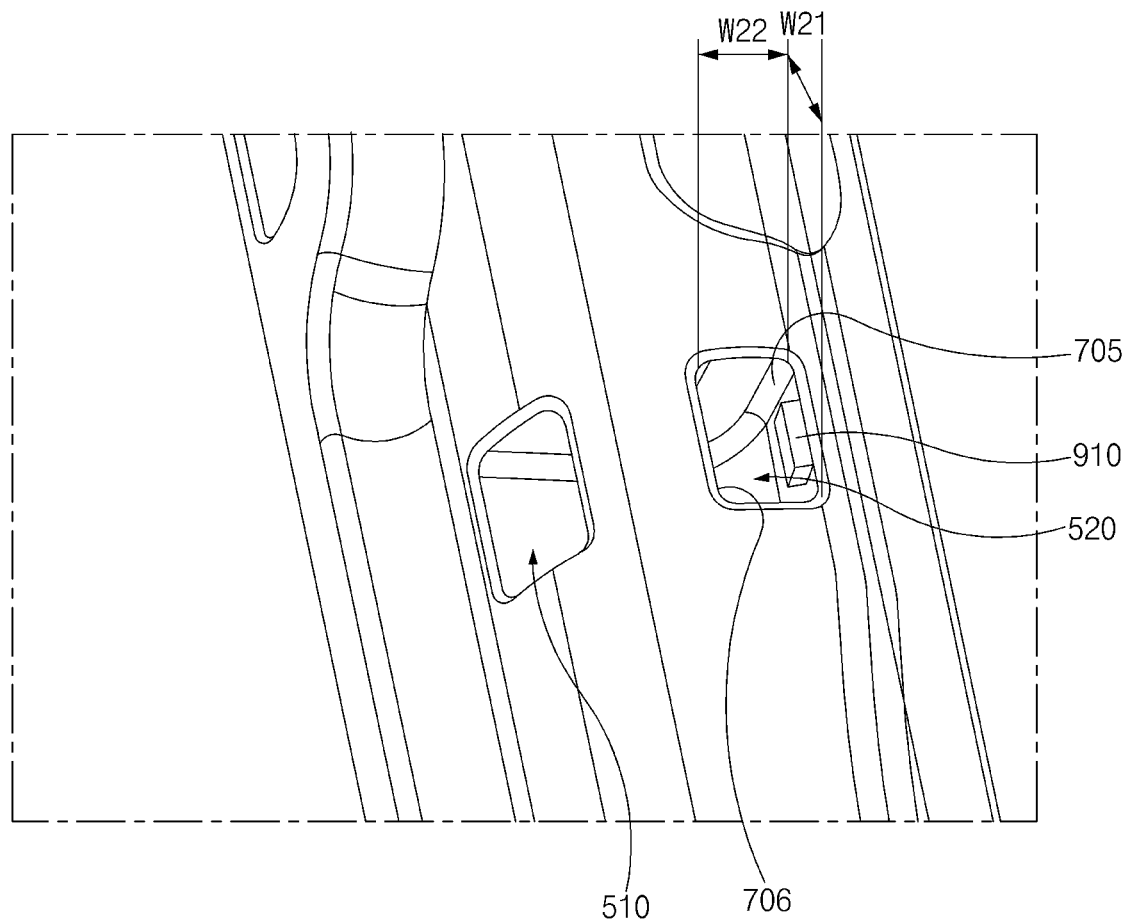
FIG. 9 is a perspective view illustrating an electronic device including a partition wall member according to an embodiment of the disclosure.

FIG. 9 is a perspective view illustrating an electronic device including a partition wall member according to an embodiment of the disclosure.

Figure 10A:
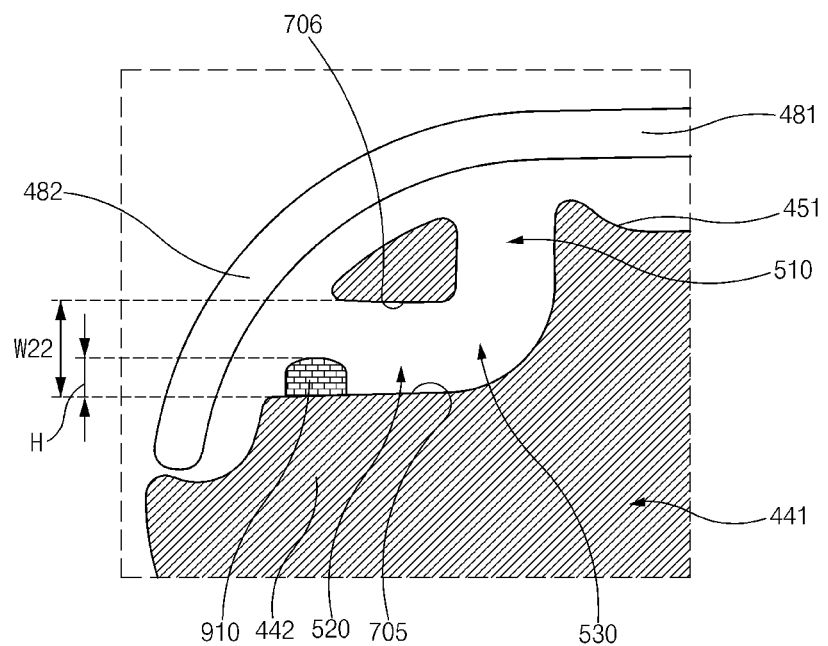
FIGS. 10A and 10B are cross-sectional views illustrating various embodiments of a protruding member illustrated in FIG. 9 according to various embodiments of the disclosure.
Figure 10B:
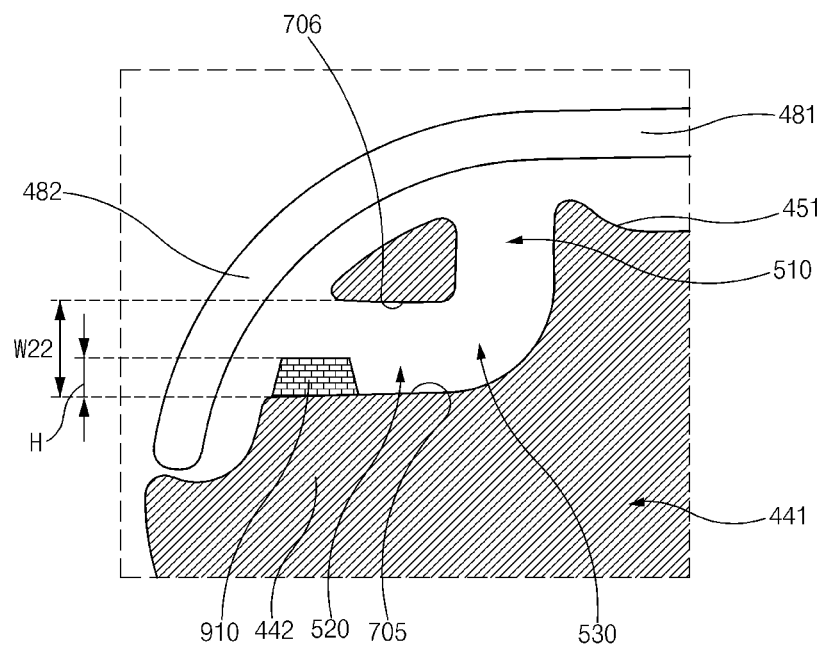

FIGS. 10A and 10B are cross-sectional views illustrating various embodiments of a partition wall member illustrated in FIG. 9 according to various embodiments of the disclosure.

FIGS. 9, 10A, and 10B may illustrate an electronic device (e.g., the electronic device 401 of FIG. 4) including a partition wall member 910 disclosed in the disclosure.

The partition wall member 910 may be disposed on an outside of the second hole area 520. The partition wall member 910 may be disposed on the extension area 442 of the side member 441. At least a portion of the partition wall member 910 may not overlap the sixth inner surface 706 of the side member 441.

The partition wall member 910 may be disposed on the fifth inner surface 705 defined by the second hole area 520, and may protrude toward the sixth inner surface 706. A size of the partition wall member 910 may be the same as or smaller than the second transverse length W21 of the second hole area 520. A height "H" of the partition wall member 910 may be lower than the second longitudinal length W22 of the second hole area 520.

The partition wall member 910, as illustrated in FIG. 10A, may have a semicircular shape, or as illustrated in FIG. 10B, may have a polygonal shape. The partition wall member 910 may be formed of a material that is the same as or different from that of the side member 441. For example, the partition wall member 910 may be integrally formed with the side member 441 with the same material as that of the side member 441.

The partition wall member 910 may restrict flows of the liquid type adhesive that constitutes the first adhesion member 410 before the rear plate 480 is attached to the side member 441. Before the rear plate 480 is attached to the side member 441, an appropriate amount or more of the first adhesion member 410 may be prevented from overflowing to an outside of the second hole area 520. Because the first adhesion member 410 may be sufficiently filled in the adhesion tunnels 500 due to the partition wall member 910, an adhesion force between the rear plate 480 and the side member 441 using the first adhesion member 410 may be enhanced. A specific amount of the first adhesion member 410 may be discharged to an outside of the second hole area 520 by a pressing force when the rear plate 480 is pressed by the side member 441, and the first adhesion member 410 may contact the curved area 482 of the rear plate 480.

Figure 11:
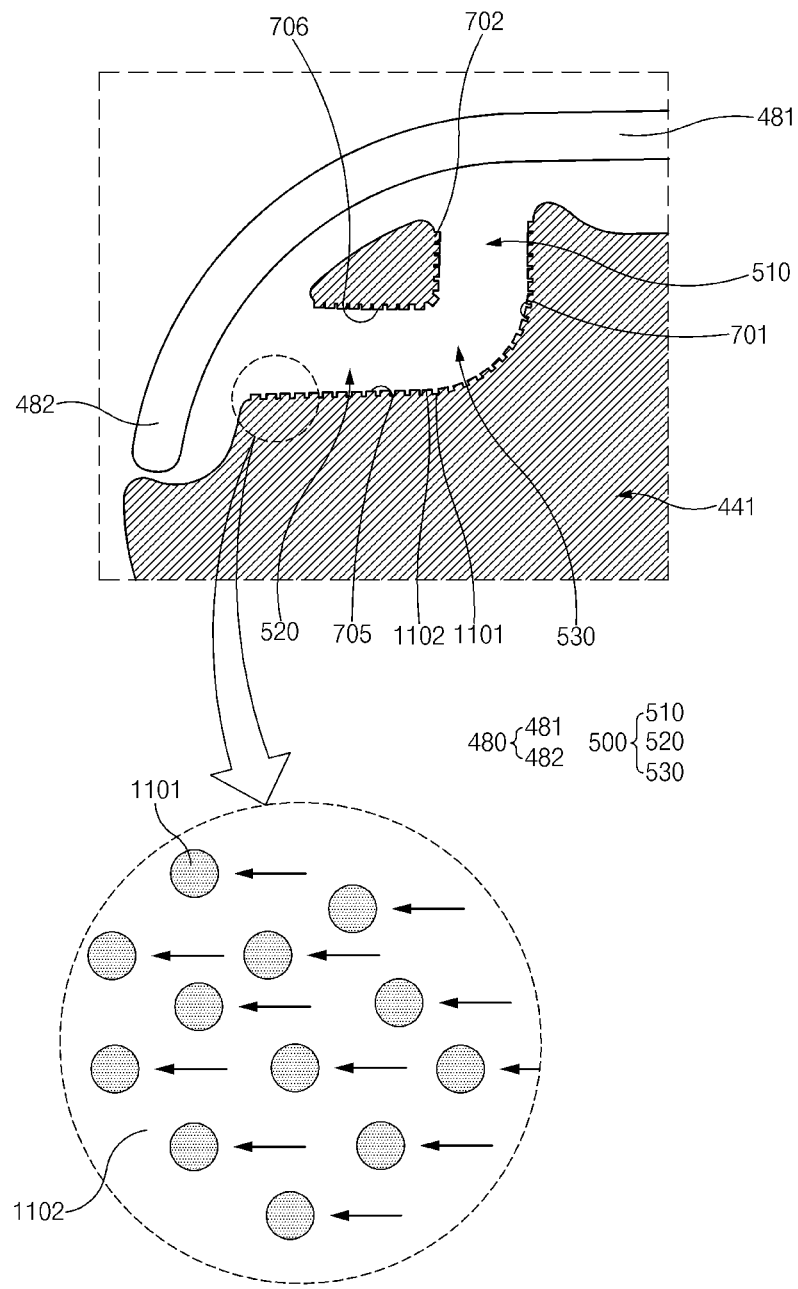
FIG. 11 is a view illustrating an electronic device including a side member having a convexo-concave surface according to an embodiment of the disclosure.

FIG. 11 is a view illustrating an electronic device including a side member having a convexo-concave surface according to an embodiment of the disclosure.

Referring to FIG. 11, the side member 441 disclosed in the disclosure may define at least any one of the plurality of inner surfaces 701, 702, 705, and 706 defined by the adhesion tunnels 500 as a convexo-concave surface in a convexo-concave form. Although FIG. 11 illustrates that the first inner surface 701, the second inner surface 702, the fifth inner surface 705, and the sixth inner surface 706 are convexo-concave surfaces, but the disclosure is not limited thereto. That is, at least any one of the plurality of surfaces defined in the interiors of the adhesion tunnels 500 may be a convexo-concave surface. For example, the first inner surface 701, the second inner surface 702, the third inner surface (e.g., the third inner surface 703 of FIG. 7A), the fourth inner surface (e.g., the fourth inner surface 704 of FIG. 7A), the fifth inner surface 705, the sixth inner surface 706, the seventh inner surface (e.g., the seventh inner surface 707 of FIG. 7A), the eighth inner surface (e.g., the eighth inner surface 708 of FIG. 7A), the first inner corner surface (e.g., the first inner corner surface 711 of FIG. 7D), and the second inner corner surface (e.g., the second inner corner surface 712 of FIG. 7D) may be convexo-concave surfaces. As another example, the fifth inner surface 705, the sixth inner surface 706, the seventh inner surface 707, the eighth inner surface 708, the first inner corner surface 711, and the second inner corner surface 712 may be convexo-concave surfaces. As another example, the fifth inner surface 705, the sixth inner surface 706, the seventh inner surface 707, and the eighth inner surface 708 may be convexo-concave surfaces.

The convexo-concave surface may include concave areas 1101 and protruding areas 1102. The concave areas 1101 may be disposed between the protruding areas 1102. The protruding areas 1102 may restrict flows of the liquid type adhesive that constitutes the first adhesion member 410 when the first adhesion member 410 is formed. Due to the protruding areas 1102, an appropriate amount or more of the first adhesion member 410 may be prevented from overflowing to an outside of the second hole area 520. Because the first adhesion member 410 may be sufficiently filled in the adhesion tunnels 500 due to the protruding areas 1102, an adhesion force between the rear plate 480 and the side member 441 using the first adhesion member 410 may be enhanced.

According to an embodiment, the protruding areas 1102 may be formed of a material that is the same as or different from that of the side member 441. For example, the protruding areas 1102 may be integrally formed with the side member 441 with the same material as that of the side member 441. According to another embodiment, the convexo-concave surface including the protruding areas 1102 may be a corroded surface.

FIGS. 12A, 12B, 12C, 12D, and 12E are views illustrating a method for manufacturing an electronic device according to various embodiments of the disclosure.

Referring to FIGS. 12A to 12E, the adhesion tunnels 500 may include the first hole area 510, the second hole area 520, and the connection area 530. The first hole area 510 may be an injection hole, through which a liquid type adhesive 1212 that forms the first adhesion member 410 is injected. The second hole area 520 may be a discharge hole, through which the liquid type bond that forms the first adhesion member 410 is discharged toward the curved area 482 of the rear plate 480. The connection area 530 may be a direction switching area for discharging the liquid type adhesive in a discharge direction that is different from the injection direction of the liquid type adhesive.

Figure 12A:
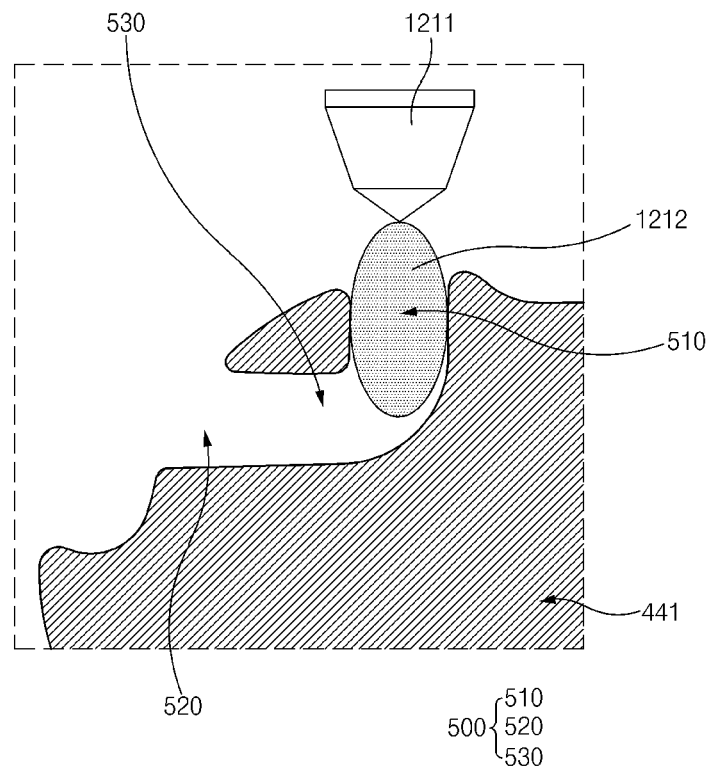
FIGS. 12A, 12B, 12C, 12D, and 12E are views illustrating a method for manufacturing an electronic device according to various embodiments of the disclosure.

In operation 1201 illustrated in FIG. 12A, a nozzle 1211 of a liquid type application equipment may be aligned with the first hole area 510 of the adhesion tunnel 500. The first liquid type adhesive 1212 may be discharged to the first hole area 510 through the nozzle 1211. The first liquid type adhesive 1212 may be formed of a polyurethane (PUR) based material, an acryl based material, or a synthetic resin based material, or may be formed of a combination (e.g., a PUR+acryl based material or a PUR+synthetic resin based material) thereof.

Figure 12B:
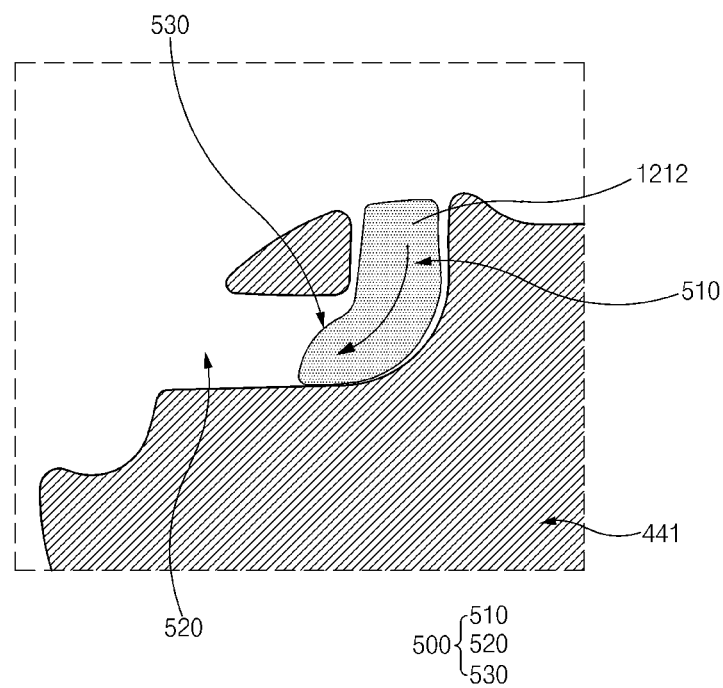

In operation 1202 illustrated in FIG. 12B, a flow direction of the first liquid type adhesive 1212 may be switched to the second hole area 520 while the first liquid type adhesive 1212 passes through the connection area 530.

Figure 12C:
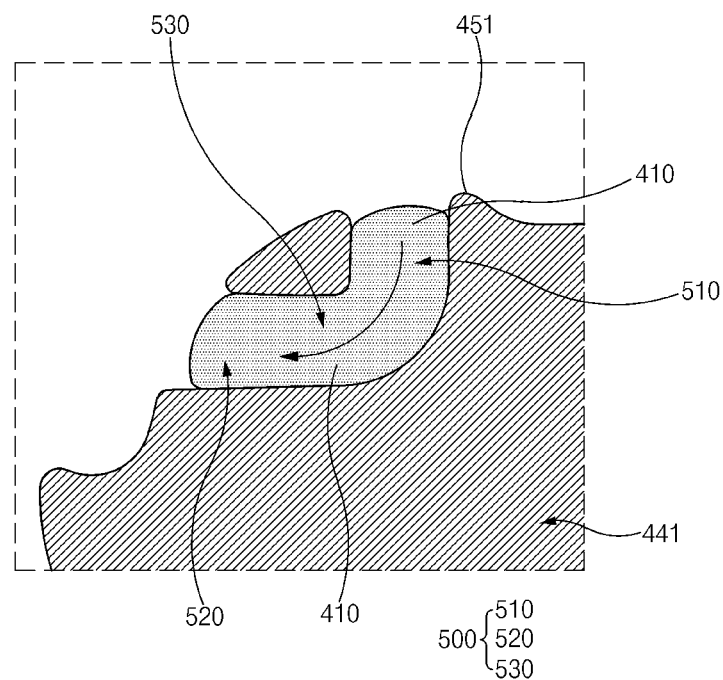

In operation 1203 illustrated in FIG. 12C, because the first liquid type adhesive 1212 is filled even in the second hole area 520, the first adhesion member 410 including the first liquid type adhesive 1212 may be filled in the adhesion tunnel 500. The first adhesion member 410 filled even in the second hole area 520, and the first outer surface 451 disposed around the first hole area 510 may be stepped from each other.

Figure 12D:
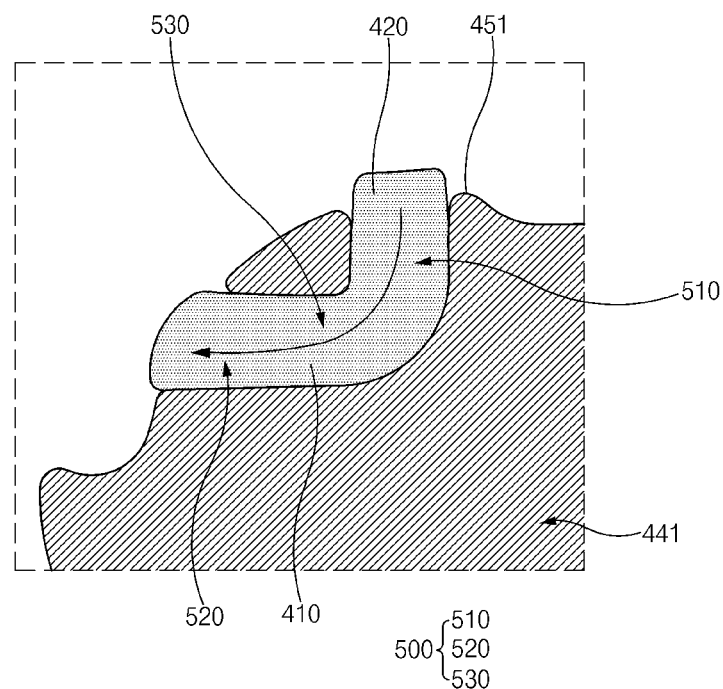

In operation 1204 illustrated in FIG. 12D, because the second liquid type adhesive is discharged through the nozzle (e.g., the nozzle of FIG. 12A) of the liquid type adhesive application equipment, the second adhesion member 420 may be formed. The second adhesion member 420 may be formed on the first adhesion member 410 along the side member 441. The second adhesion member 420 may fill a stepped area between the first adhesion member 410 and the first outer surface 451. The second adhesion member 420 may protrude further than the first outer surface 451. The second liquid type adhesive that forms the second adhesion member 420 may be formed of a material that is the same as or different from that of the first liquid type adhesive 1212.

Figure 12E:
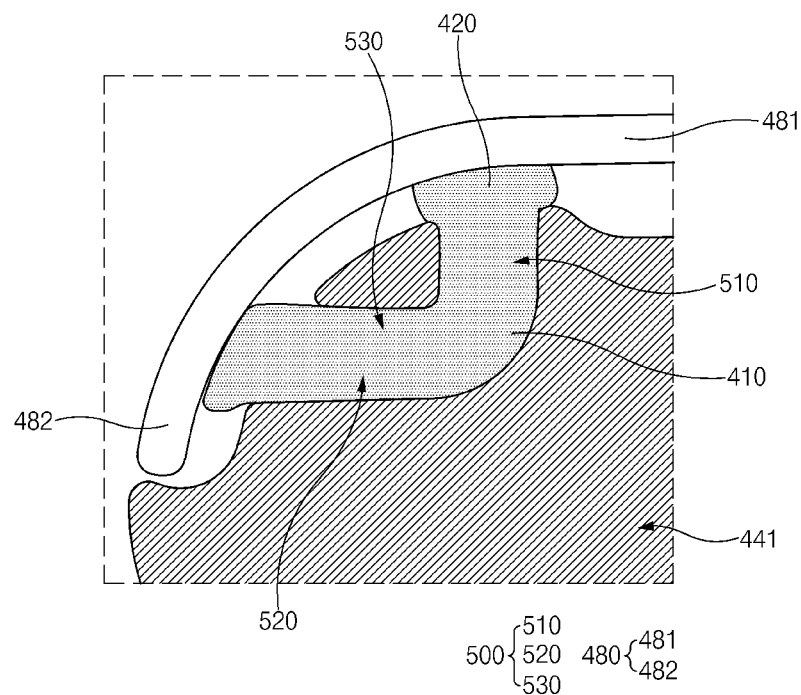

In operation 1205 illustrated in FIG. 12E, the rear plate 480 may be coupled to the side member 441 through the first adhesion member 410 and the second adhesion member 420. The curved area 482 of the rear plate 480 may be coupled to the side member 441 through the first adhesion member 410, and the flat area 481 of the rear plate 480 may be coupled to the side member 441 through the second adhesion member 420. A specific amount of the first adhesion member 410 may be discharged to an outside of the second hole area 520 by a pressing force when the rear plate 480 is pressed by the side member 441, and the first adhesion member 410 may contact the curved area 482 of the rear plate 480. The second adhesion member 420 may be brought into contact with the flat area 481 of the rear plate 480 with a width that is larger than that of the first adhesion member 410 filled in the first hole area 510 due to a pressing force generated when the rear plate 480 is pressed to the side member 441.

According to an embodiment, the first adhesion member 410 may contact the rear plate 480 within a first open time after the first liquid type adhesive 1212 is discharged into the adhesion tunnels 500. For example, the first liquid type adhesive 1212 may be coupled to the rear plate 480 within the first open time of 4 minutes or less. The first adhesion member 410 may have a thixotropic property for the first open time that is a time that is allowed until it contacts the rear plate 480. The thixotropic property may be a property of maintaining an applied state due to a strong surface tension in spite of a low viscosity.

The second adhesion member 420 may be adhered to the rear plate 480 within a second open time after the second liquid type adhesive is discharged into the first adhesion member 410. The second adhesion member 420 may have a thixotropic property for the second open time that is a time that is allowed until it contacts the rear plate 480. Because the second liquid type adhesive that forms the second adhesion member 420 is applied after the first liquid type adhesive 1212, it may be coupled to the rear plate 480 within the second open time that is shorter than in the first liquid type adhesive 1212.

According to various embodiments of the disclosure, the structure, in which the adhesion tunnels 500 are formed in the side member 441 that faces the curved area 482 and the flat area 481 of the rear plate 480, has been mainly described, but the second adhesion tunnels may be formed in the front plate (e.g., 470) and the side member 441 that faces the curved area and the flat area of the display 430 in addition. The second adhesion tunnels may be configured in a way that is the same as or similar to that of the adhesion tunnels 500 that faces the rear plate 480. The adhesion member filled in the second adhesion tunnels may be configured in a way that is the same as or similar to that of the adhesion member coupled to the rear plate.

An electronic device according to another embodiment of the disclosure includes a first plate 480 including a flat area 481 facing a first direction and a curved area 482 extending from at least a portion of a periphery of the flat area, a second plate facing a second direction that is opposite to the first direction, a side member surrounding an interior space between the first plate and the second plate and including a first outer surface facing the flat area, and a second outer surface facing the curved area, a plurality of adhesion tunnels 500 formed to pass through the side member from the first outer surface 451 to the second outer surface 452, and an adhesion member 400 filled in interiors of the plurality of adhesion tunnels to be formed between the first plate and the side member, and contacting the curved area and the flat area, and each of the plurality of adhesion tunnels 500 includes a first hole area 510 overlapping the flat area 481, and passing through the first outer surface 451, a second hole area 520 overlapping the curved area 482, and passing through the second outer surface 452, and a connection area 530 disposed between the first hole area and the second hole area, and connecting the first hole area and the second hole area.

According to the disclosure, the adhesion tunnel may be "L"-shaped.

According to the disclosure, a width of the first hole area may become larger as it goes from the connection area toward the flat area, and a width of the second hole area may become larger as it goes from the connection area toward the curved area.

According to the disclosure, the first hole area may be surrounded by a first inner surface, a second inner surface, a third inner surface, and a fourth inner surface, the second hole area may be surrounded by a fifth inner surface, a sixth inner surface, a seventh inner surface, and an eighth inner surface, at least any one of the first inner surface, the second inner surface, the third inner surface, and the fourth inner surface may be formed to be inclined with respect to an imaginary line that is parallel to a center line of the first hole area, and at least any one of the fifth inner surface, the sixth inner surface, the seventh inner surface, and the eighth inner surface may be formed to be inclined with respect to an imaginary line that is parallel to a center line of the second hole area.

According to the disclosure, the connection area may include a first inner corner surface connecting the first inner surface that face an outside of the electronic device, and the fifth inner surface, and a second inner corner surface connecting a second inner surface that faces an inside of the electronic device, and a sixth inner surface, and having a radius of curvature that is smaller than that of the first inner corner surface.

According to the disclosure, at least any one of the first inner corner surface and the second inner corner surface may be curved in a direction that defines an obtuse angle.

According to the disclosure, each of the plurality of adhesion tunnels may be disposed to be spaced apart from an adjacent adhesion tunnel in the remaining areas, except for a corner area of the side member.

According to the disclosure, the adhesion member may include a first adhesion member disposed between the curved area and the side member, and filled in the plurality of adhesion tunnels, and a second adhesion member disposed between the flat area and the side member, and formed on the side member along the side member.

According to the disclosure, the first adhesion member may contact the curved area of the first plate, and may be formed in a curved form along the curved area.

According to the disclosure, the second adhesion member may contact the flat area of the first plate, and at least a partial area thereof may be formed in a flat form along the flat area.

According to the disclosure, the second adhesion member may be formed on the first adhesion member filled in the first hole area.

According to the disclosure, the second adhesion member may be formed on the second outer surface disposed between the first hole area and the second hole area.

According to the disclosure, the fifth inner surface may extend toward the curved area rather than toward the sixth inner surface.

According to the disclosure, the electronic device may further include a partition wall member disposed on the fifth inner surface.

According to the disclosure, at least any one of the first inner surface, the second inner surface, the third inner surface, the fourth inner surface, the fifth inner surface, the sixth inner surface, the seventh inner surface, the eighth inner surface, the first inner corner surface, and the second inner corner surface may have a convexo-concave surface.

An electronic device according to yet another embodiment of the disclosure includes a rear plate including a flat area facing a first direction and a curved area extending from at least a portion of a periphery of the flat area, a front plate facing a second direction that is opposite to the first direction, a side member surrounding an interior space between the rear plate and the front plate, and having a plurality of adhesion tunnels facing the curved area from the flat area, and an adhesion member filled in interiors of the plurality of adhesion tunnels to be formed between the rear plate and the side member, and contacting the curved area and the flat area, each of the plurality of adhesion tunnels includes a first hole area overlapping the flat area and opened toward the flat area, a second hole area overlapping the curved area and opened toward the curved area, and a connection area disposed between the first hole area and the second hole area, and connecting the first hole area and the second hole area.

According to the disclosure, the adhesion tunnel may be "L"-shaped.

According to the disclosure, a width of the first hole area may become larger as it goes from the connection area toward the flat area, and a width of the second hole area may become larger as it goes from the connection area toward the curved area.

According to the disclosure, a first inner corner surface and a second inner corner surface, which face each other, may be formed in the connection area, and at least any one of the first inner corner surface and the second inner corner surface may be curved in a direction that defines an obtuse angle.

According to the disclosure, each of the plurality of adhesion tunnels may be disposed to be spaced apart from an adjacent adhesion tunnel in the remaining areas, except for a corner area of the side member.

According to the disclosure, the first hole area is an injection hole through which a liquid type adhesive that forms a first adhesion member is injected.

According to the disclosure, the second hole area is a discharge hole through which a liquid type bond that forms the first adhesion member is discharged toward the curved area of the rear plate.

According to the disclosure, the connection area comprises a direction switching area for discharging the liquid type adhesive in a discharge direction that is different from an injection direction of the liquid type adhesive.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

In the disclosure, the expression "configured to" may be interchangeably used with, for example, "suitable for", "capable of", "modified to", "made to", "able to", or "designed to" according to a situation in a hardware or software way. In some situations, the expression "a device configured to" may mean that the device is "capable of" operating together with another device or other components. central processing unit (CPU), for example, a "processor configured to (or set to) perform A, B, and C" may mean a dedicated processor (e.g., an embedded processor) for performing a corresponding operation or a generic-purpose processor (e.g., a central processing unit (CPU) or an application processor) which may perform corresponding operations by executing one or more programs which are stored in a memory device.

The term "module" used in the disclosure may include a unit configured in a hardware, software, or firmware way, and for example, may be used interchangeably with the terms such as logic, a logic block, a component, or a circuit. The "module" may be an integral component, or a minimum unit or a part which performs one or more functions. The "module" may be implemented mechanically or electronically, and for example, may include an application-specific integrated circuit (ASIC) chip, field-programmable gate arrays (FPGSs), or a programmable logic device that is known or to be developed in the future, which performs some operations.

At least some of the devices (e.g., modules or functions) or methods (e.g., operations) according to various embodiments of the disclosure may be implemented by an instruction stored in a computer-readable storage medium (e.g., the memory), for example, in the form of a program module. When the instruction is executed by the processor (for example, the processor), the processor may perform a function corresponding to the instruction. The computer-readable recording medium may include a hard disk, a floppy disk, a magnetic medium (e.g., a magnetic tape), an optical recording medium (e.g., a compact disc read only memory (CD-ROM) or a digital versatile disc (DVD)), a magneto-optical medium (e.g., a floptical disk), and an embedded memory. The instruction may include a code made by a compiler or a code that may be executed by an interpreter.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a first plate including a flat area facing a first direction and a curved area extending from at least a portion of a periphery of the flat area;
   a second plate facing a second direction that is opposite to the first direction;
   a side member surrounding an interior space between the first plate and the second plate, the side member including a first outer surface facing the flat area, and a second outer surface facing the curved area;
   a plurality of adhesion tunnels formed to pass through the side member from the first outer surface to the second outer surface; and
   an adhesion member filled in interiors of the plurality of adhesion tunnels to be formed between the first plate and the side member, and contacting the curved area and the flat area,
   wherein each of the plurality of adhesion tunnels includes:
     a first hole area overlapping the flat area, and passing through the first outer surface,
     a second hole area overlapping the curved area, and passing through the second outer surface, and
     a connection area disposed between the first hole area and the second hole area, and connecting the first hole area and the second hole area.

2. The electronic device of claim 1, wherein each of the plurality of adhesion tunnels is "L"-shaped.

3. The electronic device of claim 1,
   wherein a width of the first hole area becomes larger as it passes from the connection area toward the flat area, and
   wherein a width of the second hole area becomes larger as it passes from the connection area toward the curved area.

4. The electronic device of claim 1,
   wherein the first hole area is surrounded by a first inner surface, a second inner surface, a third inner surface, and a fourth inner surface,
   wherein the second hole area is surrounded by a fifth inner surface, a sixth inner surface, a seventh inner surface, and an eighth inner surface,
   wherein at least any one of the first inner surface, the second inner surface, the third inner surface, and the fourth inner surface is formed to be inclined with respect to an imaginary line that is parallel to a center line of the first hole area, and
   wherein at least any one of the fifth inner surface, the sixth inner surface, the seventh inner surface, and the eighth inner surface is formed to be inclined with respect to an imaginary line that is parallel to a center line of the second hole area.

5. The electronic device of claim 4, wherein the connection area includes:
   a first inner corner surface connecting the first inner surface that face an outside of the electronic device, and the fifth inner surface; and
   a second inner corner surface connecting a second inner surface that face an inside of the electronic device, and a sixth inner surface, and having a radius of curvature that is smaller than that of the first inner corner surface.

6. The electronic device of claim 5, wherein at least any one of the first inner corner surface and the second inner corner surface is curved in a direction that defines an obtuse angle.

7. The electronic device of claim 1, wherein each of the plurality of adhesion tunnels is disposed to be spaced apart from an adjacent adhesion tunnel in the remaining areas, except for a corner area of the side member.

8. The electronic device of claim 1, wherein the adhesion member includes:
   a first adhesion member disposed between the curved area and the side member, and filled in the plurality of adhesion tunnels; and
   a second adhesion member disposed between the flat area and the side member, and formed on the side member along the side member.

9. The electronic device of claim 8,
   wherein the first adhesion member contacts the curved area of the first plate, and
   wherein the first adhesion member is formed in a curved form along the curved area.

10. The electronic device of claim 8,
    wherein the second adhesion member contacts the flat area of the first plate, and
    wherein at least a partial area thereof is formed in a flat form along the flat area.

11. The electronic device of claim 8, wherein the second adhesion member is formed on the first adhesion member filled in the first hole area.

12. The electronic device of claim 8, wherein the second adhesion member is formed on the second outer surface disposed between the first hole area and the second hole area.

13. The electronic device of claim 4, wherein the fifth inner surface extends toward the curved area rather than toward the sixth inner surface.

14. The electronic device of claim 13, further comprising:
a partition wall member disposed on the fifth inner surface.

15. The electronic device of claim 5, wherein at least any one of the first inner surface, the second inner surface, the third inner surface, the fourth inner surface, the fifth inner surface, the sixth inner surface, the seventh inner surface, the eighth inner surface, the first inner corner surface, and the second inner corner surface has a convexo-concave surface.

16. The electronic device of claim 8, wherein the first hole area is an injection hole through which a liquid type adhesive that forms the first adhesion member is injected.

17. The electronic device of claim 16, wherein the second hole area is a discharge hole through which a liquid type bond that forms the first adhesion member is discharged toward the curved area of the first plate.

18. The electronic device of claim 17, wherein the connection area comprises a direction switching area for discharging the liquid type adhesive in a discharge direction that is different from an injection direction of the liquid type adhesive.

19. An electronic device comprising: a rear plate including a flat area facing a first direction and a curved area extending from at least a portion of a periphery of the flat area; a front plate facing a second direction that is opposite to the first direction; a side member surrounding an interior space between the rear plate and the front plate, the side member having a plurality of adhesion tunnels formed to pass through the side member from a first outer surface to a second outer surface; and an adhesion member filled in interiors of the plurality of adhesion tunnels to be formed between the rear plate and the side member, and contacting the curved area and the flat area, wherein each of the plurality of adhesion tunnels includes: a first hole area overlapping the flat area and opened toward the flat area, a second hole area overlapping the curved area and opened toward the curved area, and a connection area disposed between the first hole area and the second hole area, and connecting the first hole area and the second hole area.

20. The electronic device of claim 19,
wherein a first inner corner surface and a second inner corner surface, which face each other, are formed in the connection area, and
wherein at least any one of the first inner corner surface and the second inner corner surface is curved in a direction that defines an obtuse angle.

\* \* \* \* \*